(12) United States Patent
Zhou

(10) Patent No.: US 11,309,422 B2
(45) Date of Patent: Apr. 19, 2022

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 16/862,987

(22) Filed: Apr. 30, 2020

(65) Prior Publication Data

US 2021/0036146 A1    Feb. 4, 2021

(30) Foreign Application Priority Data

Jul. 30, 2019    (CN) .......................... 201910696157.5

(51) Int. Cl.
*H01L 29/78* (2006.01)
*H01L 29/66* (2006.01)
(Continued)

(52) U.S. Cl.
CPC .... *H01L 29/785* (2013.01); *H01L 21/823412* (2013.01); *H01L 21/823418* (2013.01);
(Continued)

(58) Field of Classification Search
CPC ............. H01L 29/785; H01L 29/66795; H01L 27/0886; H01L 21/823431; H01L 29/1037;
(Continued)

(56) References Cited

U.S. PATENT DOCUMENTS 10,475,902 B2 * 11/2019 Lee .................. H01L 29/78618

\* cited by examiner

*Primary Examiner* — Cuong B Nguyen
(74) *Attorney, Agent, or Firm* — Crowell & Moring LLP

(57) ABSTRACT

A semiconductor structure and a method for forming the same are provided. One form of the method includes: providing a base, where a channel stack and a tear-off structure span the channel stack being formed on the base, and the channel stack including a sacrificial layer and a channel layer; forming a groove in channel stacks on both sides of a gate structure; laterally etching the sacrificial layer exposed from the groove to form a remaining sacrificial layer; forming a source/drain doped region in the channel layer exposed from the remaining sacrificial layer; forming an interlayer dielectric layer on the base; etching the interlayer dielectric layer on one side of the source region to expose a surface of the channel layer corresponding to the source region; etching the interlayer dielectric layer on one side of the drain region to expose the surface of the channel layer corresponding to the drain region; forming a first metal silicide layer on a surface of the channel layer corresponding to the source region; forming a second metal silicide layer on a surface of the channel layer corresponding to the drain region; forming a first conductive plug covering the first metal silicide layer and a second conductive plug covering the second metal silicide layer. In the present disclosure, contact resistance of the first conductive plug, the second conductive plug, and the source/drain doped region is reduced.

16 Claims, 9 Drawing Sheets

(51) Int. Cl.
    *H01L 27/088*      (2006.01)
    *H01L 21/8234*     (2006.01)
    *H01L 29/10*       (2006.01)
    *H01L 29/06*       (2006.01)

(52) U.S. Cl.
    CPC ............ *H01L 21/823431* (2013.01); *H01L 21/823475* (2013.01); *H01L 27/0886* (2013.01); *H01L 29/0638* (2013.01); *H01L 29/1037* (2013.01); *H01L 29/66795* (2013.01)

(58) Field of Classification Search
    CPC ..... H01L 21/823412; H01L 21/823418; H01L 29/0638; H01L 21/823475; H01L 29/41725; H01L 29/0847; H01L 29/0673; H01L 29/66439; H01L 29/42392; H01L 29/78696; H01L 29/775; H01L 29/665; H01L 29/66545; H01L 2029/7858; B82Y 10/00
    See application file for complete search history.

SEMICONDUCTOR STRUCTURE AND METHOD FOR FORMING THE SAME

RELATED APPLICATIONS

The present application claims priority to Chinese Patent Appln. No. 201910696157.5, filed Jul. 30, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

During semiconductor manufacturing, with the development trend of a very-large-scale integrated circuit, a critical dimension of the integrated circuit has been continuously shrinking In order to adapt to the reduction of critical dimension, a channel length of a metal-oxide-semiconductor field-effect transistor (MOSFET) is also continuously shortened. However, as the channel length of a device shortens, a distance between a source and a drain of the device is accordingly shortened. Therefore, a capability of controlling a channel by a gate electrode accordingly deteriorates, and the difficulty of pinching the channel off by a gate voltage also becomes greater, so that a phenomenon of sub-threshold leakage, that is, the so-called short-channel effect (SCE), is easier to occur.

Therefore, in order to better meet the requirement of proportional reduction in the size of the device, a semiconductor process gradually transits from a planar transistor to a three-dimensional (3D) transistor with higher efficiency, such as a gate-all-around (GAA) transistor. In the gate-all-around transistor, the gate electrode surrounds a region in which the channel is located. In comparison to the planar transistor, the gate electrode of the gate-all-around transistor has stronger control of the channel, and can better restrain the short-channel effect.

SUMMARY

Embodiments and implementations of the present disclosure are to provide a semiconductor structure and a method for forming the same, so as to improve device performance.

To address the problem, embodiments and implementations of the present disclosure provide a method for forming a semiconductor structure. In one form, a method includes: providing a base on which one or more stacked channel stacks are formed, where the channel stack includes a sacrificial layer and a channel layer on the sacrificial layer, a gate structure is formed on the base, and the gate structure spans the channel stack and covers a portion of the top and a portion of the side walls of the channel stack; forming a groove exposed from the base in channel stacks on both sides of the gate structure; laterally etching, along a direction perpendicular to a side wall of the gate structure, a portion of the sacrificial layer exposed from the groove, to form a remaining sacrificial layer under the gate structure; forming a source/drain doped region in a channel layer exposed from the remaining sacrificial layer, where a source/drain doped region on one side of the gate structure serves as a source region, and a source/drain doped region on the other side of the gate structure serves as a drain region; after the source/drain doped region is formed, forming an interlayer dielectric layer on the base exposed from the gate structure, the interlayer dielectric layer covering side walls of the gate structure; etching an interlayer dielectric layer on one side of the source region to expose each surface of the channel layer corresponding to the source region; etching an interlayer dielectric layer on one side of the drain region to expose each surface of the channel layer corresponding to the drain region; forming a first metal silicide layer on a surface of the channel layer corresponding to the source region exposed from the interlayer dielectric layer; forming a second metal silicide layer on a surface of the channel layer corresponding to the drain region exposed from the interlayer dielectric layer; forming a first conductive plug on the base on one side of the source region, the first conductive plug further covering the first metal silicide layer; and forming a second conductive plug on the base on one side of the drain region, the second conductive plug further covering the second metal silicide layer.

Embodiments and implementations of the present disclosure further provide a semiconductor structure. In one form, a semiconductor structure includes: a base; a channel structure layer located on the base and spaced apart from the base, where the channel structure includes one or more channel layers spaced apart; a device gate structure spanning the channel structure layer and surrounding the channel layer; source/drain doped regions located in channel layers on both sides of the device gate structure, where a source/drain doped region on one side of the device gate structure serves as a source region, and a source/drain doped region on the other side of the device gate structure serves as a drain region; a first metal silicide layer covering each surface of the channel layer corresponding to the source region; a first conductive plug located on a base on one side of the device gate structure, the first conductive plug further covering the first metal silicide layer; a second conductive plug located on a base on the other side of the device gate structure, the second conductive plug further covering the second metal silicide layer; and an interlayer dielectric layer located on the base exposed from the device gate structure, the first conductive plug, and the second conductive plug, the interlayer dielectric layer covering the first conductive plug and the second conductive plug.

In comparison to the prior art, embodiments and implementations of the present disclosure have the following advantages.

In embodiments and implementations of the present disclosure, after the groove exposed from the base is formed in the channel stacks on both sides of the gate structure, a portion of the sacrificial layer exposed from the groove is laterally etched to expose surfaces of the channel layer on both sides of the gate structure, and a remaining sacrificial layer under the gate structure is formed. Then, a source/drain doped region is formed in the channel layer exposed from the remaining sacrificial layer, thereby exposing each surface of the channel layer corresponding to the source region and each surface of the channel layer corresponding to the drain region after interlayer dielectric layers on both sides of the gate structure are etched, so that the first metal silicide layer can cover each surface of the channel layer corresponding to the source region, and the second metal silicide layer can cover each surface of the channel layer corresponding to the drain region, to achieve a metal-silicide-all-around process. Therefore, after the first conductive plug is formed, a contact area of the first conductive plug with the first metal silicide layer is increased. Likewise, after the second conductive plug is formed, a contact area of the second conductive plug with the second metal silicide layer is also increased, thereby reducing contact resistance of the first conductive plug and the second conductive plug with the source/drain doped region, further improving device performance.

DETAILED DESCRIPTION

After the semiconductor technology gradually adopts GAA transistor technology, performance of a device still needs to be improved. Reasons are hereby to be analysed in combination with a semiconductor structure.

Figure 1:
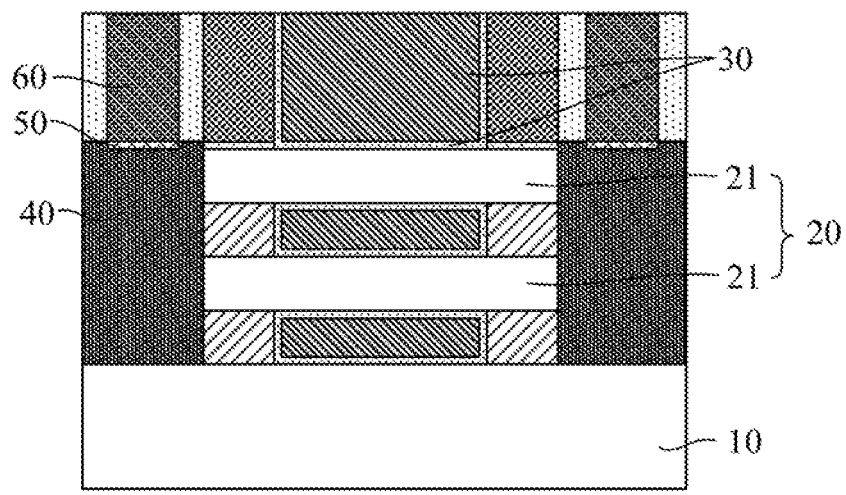
FIG. 1 is a schematic structural diagram of a semiconductor structure.

FIG. 1 shows a schematic structural diagram of a semiconductor structure.

The semiconductor structure includes: a base 10; a channel structure layer 20 located on base 10 and spaced apart from the base 10, the channel structure layer 20 including a plurality of spaced channel layers 21; a device gate structure 30 spanning the channel structure layer 20 and surrounding the channel layer 21; source/drain doped layers 40 located in the channel layers 21 on both sides of the device gate structure 30; a conductive plug 60 located at a top of the source/drain doped layer 40 and electrically connected to the source/drain doped layer 40; a metal silicide layer 50 located between a bottom of the conductive plug 60 and the source/drain doped layer 40.

The metal silicide layer 50 is used to reduce the contact resistance of the conductive plug 60 with the source/drain doped layer 40. However, the metal silicide layer 50 is only located between the bottom of the conductive plug 60 and the source/drain doped layer 40, and the contact area of the conductive plug 60 with the metal silicide layer 50 is relatively small, which easily leads to an insignificant effect of the metal silicide layer 50 for reducing the contact resistance, and therefore difficult to improve the performance of the device.

To address the technical problem, the embodiments and implementations of the present disclosure provide a method for forming a semiconductor structure, including: providing a base on which one or more stacked channel stacks are formed, the channel stack including a sacrificial layer and a channel layer on the sacrificial layer, where a gate structure is formed on the base, and the gate structure spans the channel stack and covers a portion of a top and a portion of sidewalls of the channel stack; forming a groove exposed from the base in channel stacks on both sides of the gate structure; laterally etching, along a direction perpendicular to a side wall of the gate structure, a portion of the sacrificial layer exposed from the groove, to form a remaining sacrificial layer under the gate structure; forming a source/drain doped region in a channel layer exposed from the remaining sacrificial layer, where a source/drain doped region on one side of the gate structure serves as a source region, and a source/drain doped region on the other side of the gate structure serves as a drain region; after the source/drain doped region is formed, forming an interlayer dielectric layer on the base exposed from the gate structure, the interlayer dielectric layer covering side walls of the gate structure; etching an interlayer dielectric layer on one side of the source region to expose each surface of the channel layer corresponding to the source region; etching an interlayer dielectric layer on one side of the drain region to expose each surface of the channel layer corresponding to the drain region; forming a first metal silicide layer on a surface of the channel layer corresponding to the source region exposed from the interlayer dielectric layer; forming a second metal silicide layer on a surface of the channel layer corresponding to the drain region exposed from the interlayer dielectric layer; forming a first conductive plug on the base on one side of the source region, the first conductive plug further covering the first metal silicide layer; and forming a second conductive plug on the base on one side of the drain region, the second conductive plug further covering the second metal silicide layer.

In some implementations, a portion of the sacrificial layer exposed from the groove is laterally etched to expose surfaces of the channel layer on both sides of the gate structure, and a source/drain doped region is formed in the channel layer exposed from the remaining sacrificial layer, thereby exposing each surface of the channel layer corresponding to the source region and each surface of the channel layer corresponding to the drain region after interlayer dielectric layers on both sides of the gate structure are etched, so that the first metal silicide layer can cover each surface of the channel layer corresponding to the source region, and the second metal silicide layer can cover each surface of the channel layer corresponding to the drain region, to achieve a metal-silicide-all-around process. Therefore, after the first conductive plug is formed, a contact area of the first conductive plug with the first metal silicide layer is increased. Likewise, after the second conductive plug is formed, a contact area of the second conductive plug with the second metal silicide layer is also increased, thereby reducing contact resistance of the first conductive plug, the second conductive plug, and the source/drain doped region, further improving performance of the device.

To make the foregoing objectives, features and advantages of the present disclosure easier to understand, specific embodiments and implementations of the present disclosure are described in details below with reference to the accompanying drawings.

FIG. 2 to FIG. 14 are schematic structural diagrams corresponding to steps in one form of a method for forming a semiconductor structure according to the present disclosure.

Figure 2:
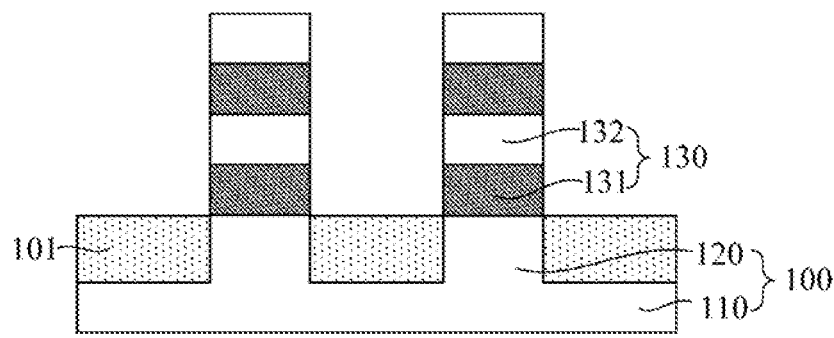
FIG. 2 to FIG. 14 are schematic structural diagrams corresponding to steps in one form of a method for forming a semiconductor structure.
Figure 3:
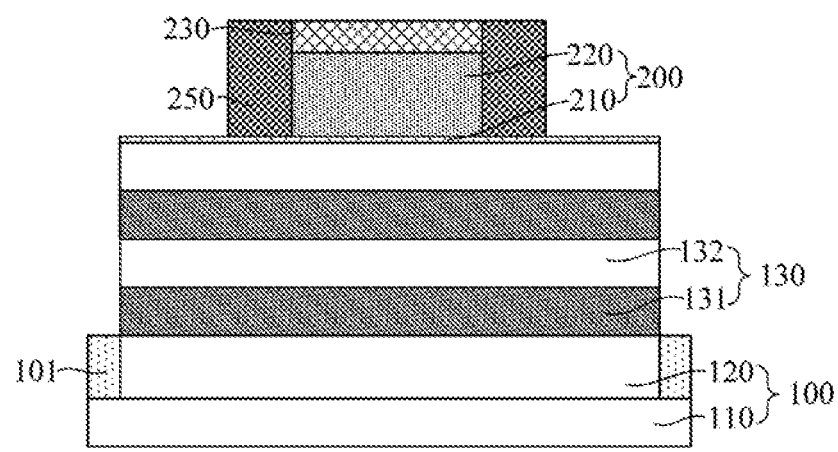

Referring to FIG. 2 and FIG. 3, FIG. 2 is a cross-sectional view taken along a secant line perpendicular to a direction in which a fin extends, and FIG. 3 is a cross-sectional view taken along a secant line in a direction a fin extends. A base 100 is provided, one or more stacked channel stacks 130 being formed on the base 100, each channel stack 130 including a sacrificial layer 131 and a channel layer 132 on the sacrificial layer 131, a gate structure 220 being formed on the base 100 (as shown in FIG. 3), and the gate structure 220 spanning the channel stack 130 and covering a portion of a top and a portion of a side wall of the channel stack 130.

The base 100 is configured to provide a process platform for subsequently forming a gate-all-around transistor.

In some implementations, the base 100 includes a substrate 110 and a fin 120 protruding from the substrate 110. In other implementations, a formed semiconductor structure may further be a planar structure. Correspondingly, the base is a planar substrate.

In some implementations, the substrate 110 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In some implementations, the fin 120 and the substrate 110 are formed into an integrated structure. In other implementations, the fin may also be a semiconductor layer epitaxially grown on the substrate, thereby controlling a height of the fin precisely.

To this end, in some implementations, the fin 120 and the substrate 110 are made of a same material, and the fin 120 is made of silicon. In other implementations, the fin may also be made of a semiconductor material such as germanium, silicon germanide, silicon carbide, gallium arsenide or indium gallide suitable for forming the fin. The material of the fin may also be different from the material of the substrate.

The sacrificial layer 131 is configured to support the channel layer 132, thereby providing a process basis for subsequently implementing spaced suspension arrangement of the channel layer 132. The sacrificial layer 131 is also configured to occupy a spatial location for subsequently forming a device gate structure, and a channel of the formed gate-all-around transistor within the channel layer 132.

As an example, two channel stacks 130 are formed on the base 100, that is, two sacrificial layers 131 and two channel layers 132 are alternately disposed on the base 100. In other implementations, there may further be one or more than two channel stacks, depending on process requirements.

In some implementations, according to device performance requirements, the channel layer 132 is made of Si, and the sacrificial layer 131 is made of SiGe. During subsequent removal of the sacrificial layer 131, SiGe and Si are of a relatively high etch selectivity. The sacrificial layer 131 is enabled to be made of SiGe, which can effectively reduce an influence of the removal process of the sacrificial layer 131 on the channel layer 132, thereby improving quality of the channel layer 132, and further helping improve the performance of the formed gate-all-around transistor.

In other implementations, when the formed gate-all-around transistor is a PMOS transistor, in order to improve the performance of the PMOS transistor, the SiGe channel technology may be adopted. Correspondingly, the base and the channel layer are both made of SiGe, and the sacrificial layer is made of Si.

In some implementations, an isolation layer 101 is formed on the substrate 110 exposed from the fin 120, the isolation layer 101 covers a side wall of the fin 120.

The isolation layer 101 is used as a shallow trench isolation (STI) structure for isolating adjacent devices. In some implementations, the isolation layer 101 is made of silicon oxide. In other implementations, the isolation layer may also be made of other insulating materials such as silicon nitride or silicon oxynitride.

In some implementations, the isolation layer 101 is formed through sequentially performing steps of film deposition, planarization, and etching back. Specifically, a process used in the deposition step is a flowable chemical vapor deposition (FCVD) process. The FCVD process has pretty good gap-filling capability, which helps reduce the probability of forming defects such as voids and/or seams in the isolation layer 101, and correspondingly helps improve an isolation effect of the isolation layer 101.

In some implementations, a top face of the isolation layer 101 is flush with a top face of the fin 120, thereby reducing the probability that the fin 120 is configured to form a parasitic device. Correspondingly, the isolation layer 101 is exposed from sidewalls of the channel stack 130.

The gate structure 220 is configured to form a dummy gate structure 200 (shown in FIG. 3), and the gate structure 220 is configured to occupy a spatial location for subsequently forming a device gate structure that completely surrounds the channel layer 132.

In some implementations, the gate structure 220 is made of polysilicon. The process of subsequently removing the gate structure 220 has less loss to the isolation layer 101, which helps reduce the probability that the isolation layer 101 is exposed from the side wall of the fin 120, thereby reducing the probability that the fin 120 is configured to form a parasitic device, and correspondingly improving the performance of the device. In other implementations, the gate structure may further be made of amorphous carbon.

In some implementations, after the isolation layer 101 is formed, before the gate structure 220 is formed, the method further includes: forming a dummy gate oxide layer 210 on a surface of the channel stack 130.

The dummy gate oxide layer 210 is also used as a portion of a dummy gate structure 200. In addition, during subsequent etching to remove the gate structure 220, a surface of the dummy gate oxide layer 210 is configured to define a stop location of an etching process, thereby reducing a probability of damage to the channel stack 130.

In some implementations, the dummy gate oxide layer 210 is made of silicon oxide. In other implementations, the dummy gate oxide layer may further be made of silicon oxynitride.

A gate mask layer 230 is also formed on the top of the gate structure 220. The gate mask layer 230 serves as an etching mask for forming the gate structure 220. The gate mask layer 230 is further configured to protect the gate structure 220 during the subsequent process, so that the gate structure 220 is not easily damaged. In some implementations, the gate mask layer 230 is made of silicon nitride.

In some implementations, after the gate structure 220 is formed, the method further includes: forming a spacer 250 on a side wall of the gate structure 220.

The spacer 250 is configured to protect the side wall of the gate structure 220, and is further configured to define a region for forming a source/drain doped region subsequently, so that there is a specific distance between the subsequently formed source/drain doped region and a device gate structure.

The spacer 250 may be made of at least one of silicon oxide, silicon nitride, silicon carbide, silicon carbonitride, silicon oxy-carbonitride, silicon oxynitride, boron nitride, or boron carbonitride, and the spacer 250 may be a single-layer structure or a stack structure. In some implementations, the spacer 250 is made of silicon nitride.

It should be noted that, unless otherwise specified, the subsequent drawings are all cross-sectional views taken along a secant line in the direction the fin extends.

Figure 4:
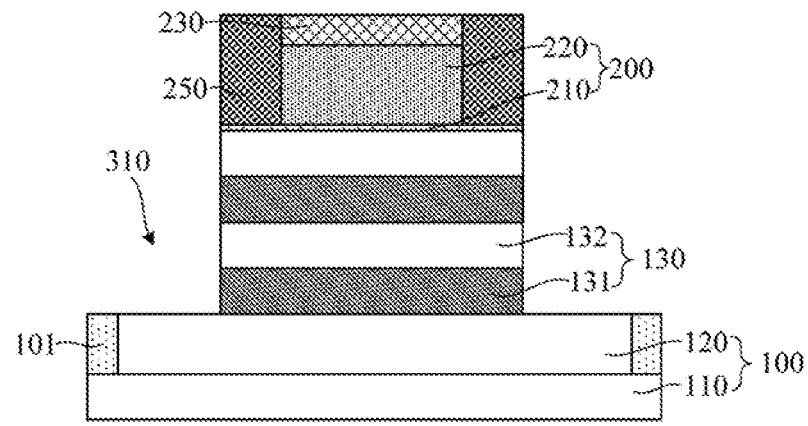

Referring to FIG. 4, a groove 310 exposed from the base 100 is formed in channel stacks 130 on both sides of the gate structure 220.

The groove 310 is exposed from ends of channel layers 132 on both sides of the gate structure 220, thereby providing a process basis for subsequently forming source/drain doped regions in the channel layers 132 on both sides of the gate structure 220.

In some implementations, the groove 310 is configured to provide a spatial location for forming a doped epitaxial layer subsequently.

Specifically, process steps of forming the groove 310 include: etching the channel stacks 130 on both sides of the gate structure 220 using the spacer 250 as a hard-mask, to form the groove 310. Correspondingly, a side wall of the spacer 250 is flush with a side wall of the groove 310.

In some implementations, the channel stacks 130 are etched until being exposed from the fin 120 to form the groove 310. In other implementations, according to process requirements, the method may further be: etching the channel stack and a portion of the fin in thickness, to form the groove.

In some implementations, the channel stacks 130 are etched using a dry etching process. The dry etching process has an anisotropic etching feature, which helps improve profile feature quality of the groove 310.

It should be noted that a dummy gate oxide layer 210 is formed on a surface of the channel stack 130. Therefore, before the channel stack 130 is etched, the method further includes: etching dummy gate oxide layers 210 on both sides of the gate structure 220, to expose a top of the channel stack 130.

Figure 5:
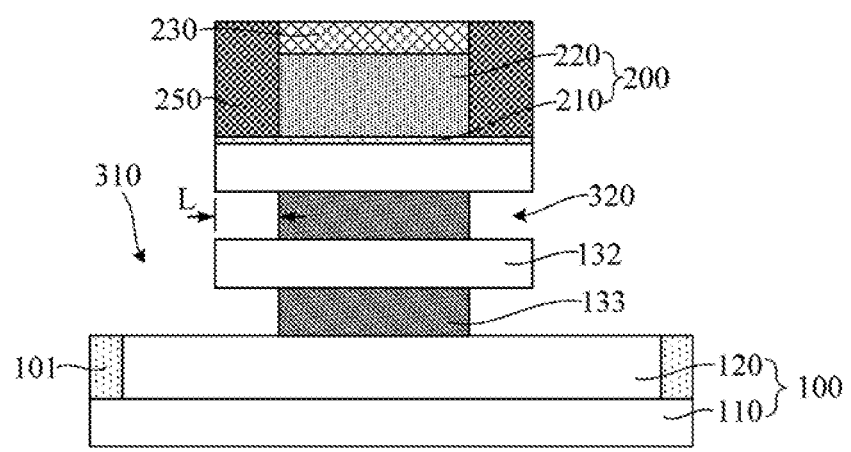

Referring to FIG. 5, a portion of the sacrificial layer 131 (as shown in FIG. 4) exposed from the groove 310 is laterally etched along a direction perpendicular to a side wall of the gate structure 220, to form a remaining sacrificial layer 133 under the gate structure 220.

The remaining sacrificial layer 133 is exposed from the channel layers 132 on both sides of the gate structure 220, thereby providing a process basis for subsequently forming source/drain doped regions in the channel layers 132 on both sides of the gate structure 220.

Moreover, the subsequent process further includes: forming a metal silicide layer on surfaces of the channel layers 132 corresponding to the source/drain doped region, where the remaining sacrificial layer 133 is exposed from each surface of the channel layers 132 on both sides of the gate structure 220, so that the metal silicide layer can cover each surface of the channel layer 132 corresponding to the source/drain doped region.

In addition, an end of the remaining sacrificial layer 133 is retracted by laterally etching a portion of the sacrificial layer 131 exposed from the groove 310, so that the adjacent channel layer 132 and the remaining sacrificial layer 133 form a trench 320, and the channel layer 132 closest to the base 100, the substrate 100, and the remaining sacrificial layer 133 form a trench 320, the trench 320 being configured to provide a spatial location for subsequently forming a barrier layer.

In some implementations, a portion of the sacrificial layer 131 exposed from the groove 310 is laterally etched using a wet etching process. The wet etching process has an isotropic etching feature, so that the sacrificial layer 131 can be laterally etched along a direction perpendicular to the side wall of the gate structure 220.

Specifically, during etching of a portion of the sacrificial layer 131, a rate of etching the sacrificial layer 131 using the wet etching process is greater than a rate of etching the channel layer 132 and the base 100, thereby reducing losses of the channel layer 132 and the base 100 using the wet etching process.

In some implementations, the channel layer 132 and the base 100 are made of Si, and the sacrificial layer 131 is made of SiGe. Therefore, a portion of the sacrificial layer 131 is etched through HCl vapor. A difference between a rate of etching the SiGe material through HCl vapor and a rate of etching the Si material through HCl vapor is relatively large. Therefore, a portion of the sacrificial layer 131 is etched using the HCl vapor, which can effectively reduce the probability of causing loss to the channel layer 132 and the base 100, so that performance of a device can be ensured.

It should be noted that, along a direction perpendicular to the side wall of the gate structure 220, when a depth of the trench 320 is less than a thickness of the spacer 250, on either side of the gate structure 220, a distance from the side wall of the remaining sacrificial layer 133 to the side wall of the gate structure 220 is a positive value; when a depth of the trench 320 is greater than a thickness of the spacer 250, on either side of the gate structure 220, a distance from the side wall of the remaining sacrificial layer 133 to the side wall of the gate structure 220 is a negative value.

A distance from the side wall of the first dielectric layer 133 to the side wall of the gate structure 220 should be neither excessively small nor excessively large. The remaining sacrificial layer 133 is configured to occupy a spatial location for a subsequently formed device gate structure. If the distance is excessively small, that is, when the depth of the trench 320 is greater than the thickness of the spacer 250 and the depth of the trench 320 is excessively large, a width of a device gate structure for surrounding a portion of the channel layer 132 is likely to be excessively small, thereby easily reducing controllability of the device gate structure to the channel, and further having an adverse effect on performance of the device. If the distance is excessively large, that is, when the depth of the trench 320 is less than the thickness of the spacer 250 and the depth of the trench 320 is excessively small, a length L of the channel layer 132 exposed from the remaining sacrificial layer 133 is excessively small, and the source/drain doped regions are formed in the channel layers 132 on both sides of the gate structure 220, which correspondingly causes a volume of the source/drain doped region to be excessively small, thereby having an adverse effect on the performance of the device. In addition, the metal silicide layer subsequently covers each surface of the channel layer 132 corresponding to the source/drain doped region, which correspondingly reduces a surface area of the metal silicide layer. Moreover, this results in a difficulty for the trench 320 to provide sufficient space for subsequently forming a barrier layer. To this end, in some implementations, the distance from the side wall of the sacrificial layer 133 to the side wall of the gate structure 220 is −3 nm to 3 nm.

Figure 6:
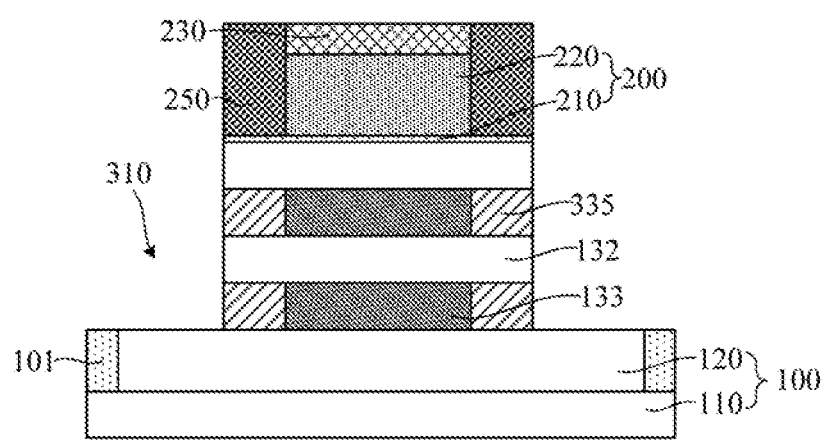
Figure 7:
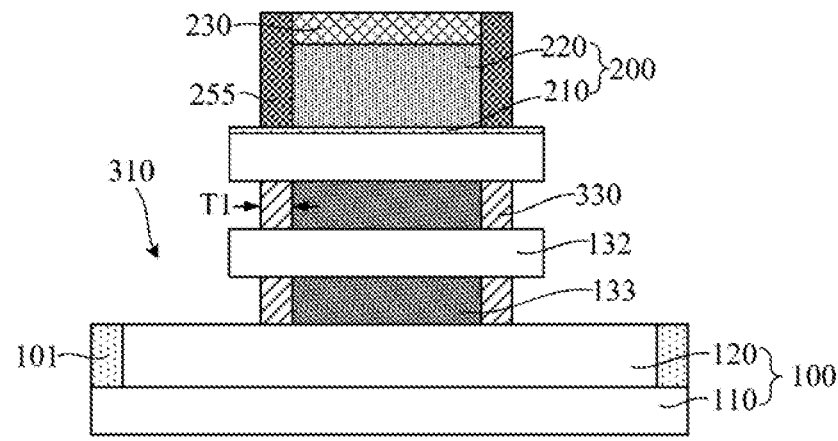

Referring to FIG. 6 and FIG. 7, after a portion of the sacrificial layer 131 (as shown in FIG. 4) exposed from the groove 310 is laterally etched, the forming method further includes: forming a barrier layer 330 (as shown in FIG. 7) on the side wall of the remaining sacrificial layer 133, the barrier layer 330 having a thickness less than a length L (as shown in FIG. 5) of the channel layer 132 exposed from the remaining sacrificial layer 133.

Subsequently, source/drain doped regions are formed in the channel layers 132 on both sides of the gate structure 220, a metal silicide layer covers each surface of the channel layer 132 corresponding to the source/drain doped region, and a conductive plug further covers the metal silicide layer.

In addition, subsequently formed device gate structures are formed at locations corresponding to the dummy gate structure 220 and the remaining sacrificial layer 133. Therefore, the barrier layer 330 is beneficial of reducing parasitic capacitance between the device gate structure and the conductive plug, thereby further enhancing the performance of the device.

Moreover, a portion of the sacrificial layer 131 exposed from the groove 310 is laterally etched before the source/drain doped region is formed, which prevents the lateral etching process from adversely affecting the source/drain doped region.

Therefore, the barrier layer 330 is made of a dielectric material. The barrier layer 330 may be made of silicon nitride, silicon nitro-carbide, silicon nitro-boride, silicon oxy-nitro-carbide, or silicon oxynitride.

In some implementations, the barrier layer 330 is made of silicon nitride. Correspondingly, the barrier layer 330 and the spacer 250 are made of a same material.

In some implementations, process steps of forming the barrier layer 330 include: as shown in FIG. 6, forming an initial barrier layer 335 on the side wall of the remaining sacrificial layer 133, the side wall of the initial barrier layer 335 being flush with the side wall of the channel layer 132 exposed from the remaining sacrificial layer 133.

The initial barrier layer 335 is configured to make preparation for subsequently forming a barrier layer.

In some implementations, the initial barrier layer 335 is made of silicon nitride.

In some implementations, a deposition process with better gap-filling performance is used to form the initial barrier layer 335. Specifically, the deposition process is an atomic layer deposition process, which has a good step coverage and gap filling capability, and benefits to improve filling quality of the initial barrier layer 335 in the trench 320.

Specifically, process steps of forming the initial barrier layer 335 include: forming a barrier material layer (not shown) in the trench 320 using an atomic layer deposition process, the barrier material layer further conformally covering the side wall and a top of the spacer 250, a top of the gate mask layer 230, the side wall of the channel layer 132, and a top of the base 100; removing the barrier material layer on the side wall and the top of the spacer 250, the top of the gate mask layer 230, the side wall of the channel layer 132, and the top of the base 100 along a direction perpendicular to the surface of the base 100 through etching, and retaining the barrier material layer in the trench 320 as the initial barrier layer 335.

In some implementations, the barrier material layer is etched using a dry etching process. The dry etching process has an anisotropic etching feature, so that the barrier material layer in the trench 320 is retained through coverage of the spacer 250 and the channel layer 132, and the side wall and a bottom of the groove 310 are exposed, thereby providing a process basis for the subsequent process.

It should be noted that, in other implementations, the deposition process may also be a low pressure chemical vapor deposition process.

As shown in FIG. 7, a portion of the initial barrier layer 335 (as shown in FIG. 6) in thickness is laterally etched along a direction perpendicular to the side wall of the gate structure 220, the remaining initial barrier layer 335 serving as the barrier layer 330.

In some implementations, a portion of the initial barrier layer 335 exposed from the groove 310 is laterally etched using an isotropic dry etching process. The isotropic dry etching process is selected, which is beneficial to improve controllability of the lateral etching process.

Specifically, an isotropic etching effect is easily achieved, by reducing bias power of the dry etching process, for the initial barrier layer 335 exposed from the groove 310.

It should be noted that, in some implementations, the initial barrier layer 335 and the spacer 250 are made of a same material. Therefore, when the initial barrier layer 335 is laterally etched, a portion of the spacer 250 in thickness is also laterally etched, forming a remaining spacer 255. Correspondingly, a side wall of the remaining spacer 255 is flush with a side wall of the barrier layer 330 at a same side.

The initial barrier layer 335 and the spacer 250 are made of the same material, the spacer 250 can be laterally etched when the initial barrier layer 335 is laterally etched, thereby increasing a surface area of the channel layer 132 exposed from the groove 310, and further increasing a contact area of a metal silicide layer with the channel layer 132 subsequently without increasing complexity of the process.

It should further be noted that a ratio of a thickness T1 of the barrier layer 330 to a length L (as shown in FIG. 5) of the channel layer 132 exposed from the remaining sacrificial layer 133 should be neither extremely small nor extremely large. If the ratio is extremely small, the thickness T1 of the barrier layer 330 is correspondingly extremely small, thereby easily causing parasitic capacitance between the subsequent device gate structure and the conductive plug to be excessively large. If the ratio is extremely large, the thickness T1 of the barrier layer 330 is correspondingly extremely large, thereby easily causing the contact area of the subsequent metal silicide layer with the channel layer 132 to be extremely small. To this end, in some implementations, the thickness T1 of the barrier layer 330 is ⅕ to ⅓ of the length L of the channel layer 132 exposed from the remaining sacrificial layer 133.

Figure 8:
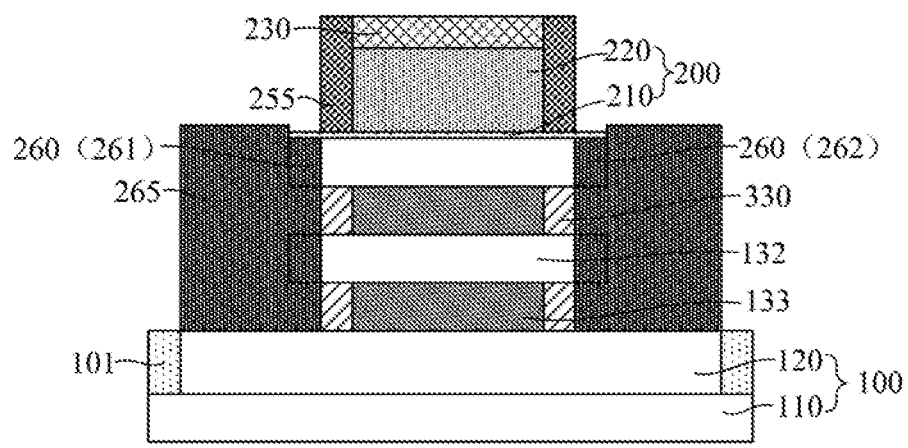

Referring to FIG. 8, a source/drain doped region 260 is formed in the channel layer 132 exposed from the remaining sacrificial layer 133, where a source/drain doped region 260 on one side of the gate structure 220 serves as a source region 261, and a source/drain doped region 260 on the other side of the gate structure 220 serves as a drain region 262.

The groove 310 (as shown in FIG. 7) is exposed from a top face, a bottom face, and a side wall of channel layers 132 on both sides of the gate structure 220. Therefore, a source/drain doped region 260 is formed in the channel layer 132 exposed from the remaining sacrificial layer 133, increasing a contact area of a metal silicide layer with the source/drain doped region 260.

Specifically, the step of forming the source/drain doped region 260 includes: forming a doped epitaxial layer 265 in the groove 310, the doped epitaxial layer 265 covering a surface of the channel layer 132 exposed from the remaining sacrificial layer 133, and doped ions in the doped epitaxial layer 265 diffusing into the channel layer 132, to form the source/drain doped region 260 in the channel layer 132.

In some implementations, the doped epitaxial layer 265 covers surfaces of the channel layers 132 on both sides of the gate structure 220, so as to dope ions into the channel layers 132 on both sides of the gate structure 220 in a manner of ion diffusion, reducing the process difficulty of forming the source/drain doped region 260, and helping improve doping concentration uniformity in the channel layer 132.

Moreover, in some implementations, the source/drain doped region 260 is formed after a portion of the sacrificial layer 131 (as shown in FIG. 4) exposed from the groove 310 is laterally etched, so that the doped epitaxial layer 265 covers top faces, bottom faces, and side walls of the channel layers 132 on both sides of the gate structure 220, and the doped ions in the doped epitaxial layer 265 can pass through the each face of the channel layer 132 exposed from the remaining sacrificial layer 133 to diffuse into the channel layer 132, which helps improve efficiency of diffusion of doped ions into the channel layer 132 and helps improve uniformity of doping concentration in the channel layer 132.

In some implementations, the step of forming a doped epitaxial layer 265 in the groove 310 includes: forming an epitaxial layer in the groove 310, and performing in-situ self-doping during forming of the epitaxial layer. The doping concentration uniformity of the doped epitaxial layer 265 is made higher in a manner of in-situ self-doping, so that the doping concentrations of the source/drain doped regions 260 in the channel layers 132 are close to each other.

When the formed semiconductor structure is a positive channel metal oxide semiconductor (PMOS) transistor, the doped epitaxial layer 265 is made of silicon doped with P-type ions or silicon germanium, that is, the epitaxial layer is made of silicon or silicon germanium. The P-type ions include B, Ga, or In.

When the formed semiconductor structure is a negative channel metal oxide semiconductor (NMOS) transistor, the doped epitaxial layer 265 is made of silicon doped with N-type ions, silicon carbide, or silicon phosphide, that is, the epitaxial layer is made of silicon, silicon carbide, or silicon phosphide. The N-type ions include P, As, or Sb.

It should be noted that, in the step of forming the doped epitaxial layer 265, the doped epitaxial layer 265 has a first pre-set doping concentration. In the step of forming the source/drain doped region 260 according to requirements of device performance, the source/drain doped region 260 has a second pre-set doping concentration, and the first pre-set doping concentration needs to be adjusted to a reasonable range, so that the second pre-set doping concentration can satisfy the requirements of device performance.

Therefore, the first pre-set doping concentration should be neither too low nor too high. If the first pre-set doping concentration is too low, it is difficult for the doped ions in the doped epitaxial layer 265 to diffuse into the channel layer 132, thereby causing the second pre-set doping concentration to be difficult to meet the requirements of the device performance. If the first pre-set doping concentration is too high, the second pre-set doping concentration is correspondingly too high, resulting in an offset in device performance. To this end, in some implementations, the first pre-set doping concentration is 1.5 times to 5 times of the second pre-set doping concentration.

Figure 9:
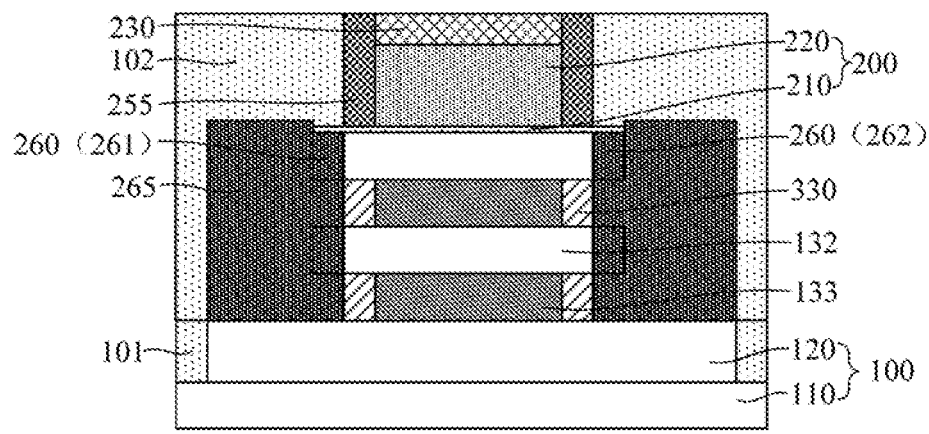

Referring to FIG. 9, an interlayer dielectric layer 102 is formed on a base 100 (as shown in FIG. 3) exposed from the gate structure 220 after the source/drain doped region 260 is formed, the interlayer dielectric layer 102 covering a side wall of the gate structure 220.

The interlayer dielectric layer 102 is configured to implement electric isolation between adjacent devices, and is further configured to define a size and a location of a metal gate structure formed subsequently.

Therefore, the interlayer dielectric layer 102 is made of an insulating material. In some implementations, the interlayer dielectric layer 102 is made of silicon oxide. In other implementations, the interlayer dielectric layer may further be made of other dielectric materials such as silicon nitride or silicon oxynitride.

In some implementations, the interlayer dielectric layer 102 is formed on a substrate 110 exposed from the fin 120, and the interlayer dielectric layer 102 covers the source/drain doped region 260.

Specifically, the interlayer dielectric layer 102 is formed using a deposition process and a planarization process that are sequentially performed.

During the planarization process, a top of the gate mask layer 230 is used as a stop location. Therefore, the top of the interlayer dielectric layer 102 is flush with the top of the gate mask layer 230.

Figure 10:
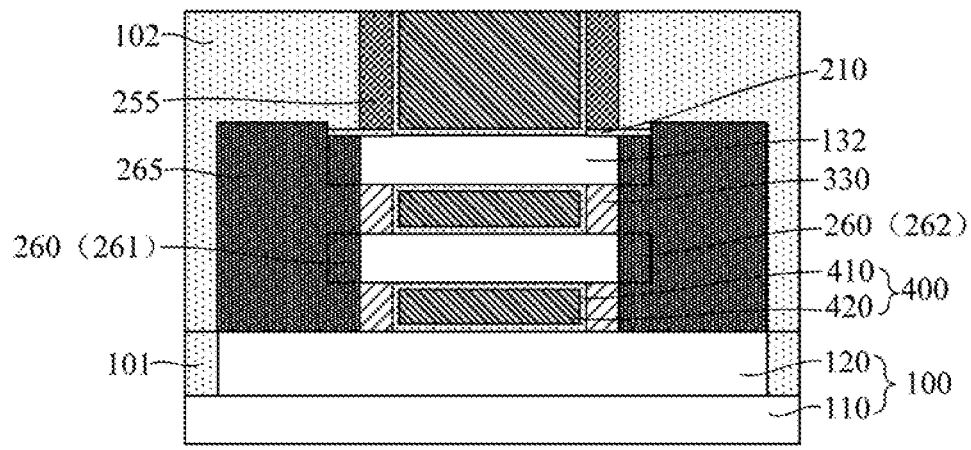

Referring to FIG. 10, the forming method further includes: removing the gate structure 220 and the remaining sacrificial layer 133, and forming device gate structures 400 at locations corresponding to the gate structure 220 and the remaining sacrificial layer 133.

The device gate structure 400 is configured to control opening and closing of a device channel.

In some implementations, the device gate structure 400 includes a gate dielectric layer 410 and a gate electrode layer 420 located on the gate dielectric layer 410.

The gate dielectric layer 410 is configured to implement electrical isolation between the gate electrode layer 420 and the channel. The gate dielectric layer 410 is made of a high-k dielectric material. The high-k dielectric material refers to a dielectric material having a relative dielectric constant greater than a relative dielectric constant of silicon oxide. In some implementations, the gate dielectric layer 410 is made of $HfO_2$. In other implementations, the gate dielectric layer may also be made of a material selected from $ZrO_2$, HfSiO, HfSiON, HfTaO, HfTiO, HfZrO, or $Al_2O_3$, or the like.

The gate electrode layer 420 is used as an electrode to implement electrical connection to an external circuit. In some implementations, the gate electrode layer 420 is made of W. In other implementations, the gate electrode layer may further be made of Al, Cu, Ag, Au, Pt, Ni, Ti, or the like.

In particular, the step of removing the gate structure 220 and a remaining sacrificial layer 133 includes: removing the gate structure 220, and forming a gate opening (not shown in the figure) in the interlayer dielectric layer 102; and removing the remaining sacrificial layer 133 exposed from the gate opening, and forming a gap (not shown in the figure) in communication with the gate opening under the channel layer 132.

In some implementations, the gate structure 220 is removed using the dry etching process. The dry etching process has a feature of anisotropic etching. The dry etching process is selected, which can help obtain a gate opening having a relatively vertical side wall and can improve efficiency of removing the gate structure 220.

A gate mask layer 230 is further formed on the top of the gate structure 220. Therefore, before the gate structure 220 is removed, the method further includes: removing the gate mask layer 230.

A dummy gate oxide layer 210 is further formed between the gate structure 220 and the channel layer 132. Therefore, after the gate structure 220 is removed, the method further includes: removing the dummy gate oxide layer 210 exposed from the gate opening.

In some implementations, the remaining sacrificial layer 132 is etched through HCl vapor, thereby effectively reducing the probability of loss to the channel layer 132.

After the remaining sacrificial layer 133 exposed from the gate opening is removed, both ends of the channel layer 132 are connected to the doped epitaxial layer 265 and suspended within the gate opening. Correspondingly, the device gate structure 400 is formed between the gate opening and the gap, and the device gate structure 400 surrounds the channel layer 132.

It should be noted that, after the gate dielectric layer 410 is formed, before the gate electrode layer 420 is formed, the step of forming the device gate structure further includes the step of forming a functional layer such as a work function layer. For convenience of illustration, other functional layers are not illustrated in some implementations.

Figure 11:
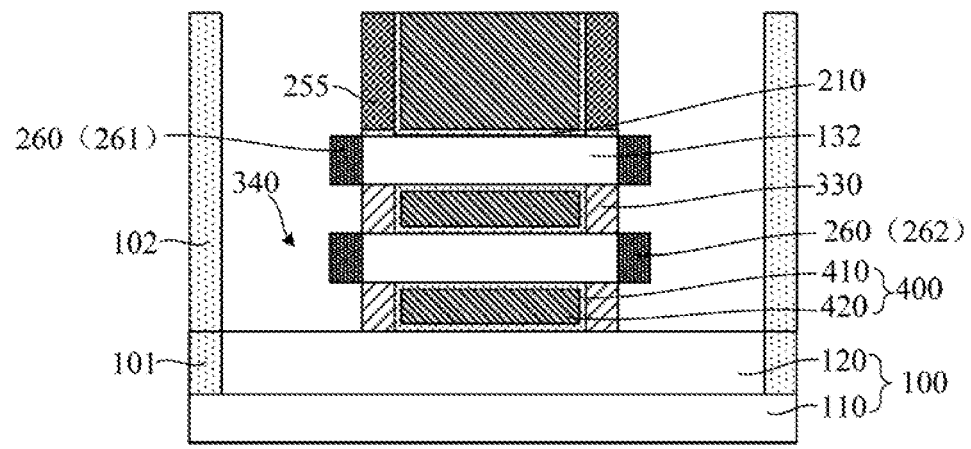

Referring to FIG. 11, interlayer dielectric layers 102 on both sides of a device gate structure 400 are etched, to form an opening 340 exposed from a base 100. The opening 340 is exposed from each surface of channel layers 132 corresponding to source regions 261 and from each surface of a channel layer 132 corresponding to the drain region 262.

The opening 340 is configured to provide a spatial location for a first metal silicide layer and a second metal silicide layer that are subsequently formed.

In some implementations, in order to simplify the process steps, the step of etching interlayer dielectric layers 102 on both sides of the device gate structure 400 includes: etching an interlayer dielectric layer 102 on one side of the source region 261 and an interlayer dielectric layer 102 on one side of the drain region 262 in a same step.

Specifically, the interlayer dielectric layers 102 and doped epitaxial layers 265 on both sides of the device gate structure 400 are etched in sequence (as shown in FIG. 10), to form the opening 340. The opening 340 is exposed from each surface of a channel layer 132 corresponding to the source region 261, from each surface of the channel layer 132 corresponding to the drain region 262, and from the base 100.

In some implementations, after the opening 340 is formed, the doped epitaxial layer 265 is completely removed, thereby increasing an opening size of the opening 340, and further increasing a process window for subsequently forming the metal silicide layer.

In some implementations, the interlayer dielectric layers 102 are etched using the dry etching process.

In some implementations, the doped epitaxial layer 265 is etched using a wet etching process, thereby removing the doped epitaxial layer 265 located in the trench 320 (as shown in FIG. 5).

Figure 12:
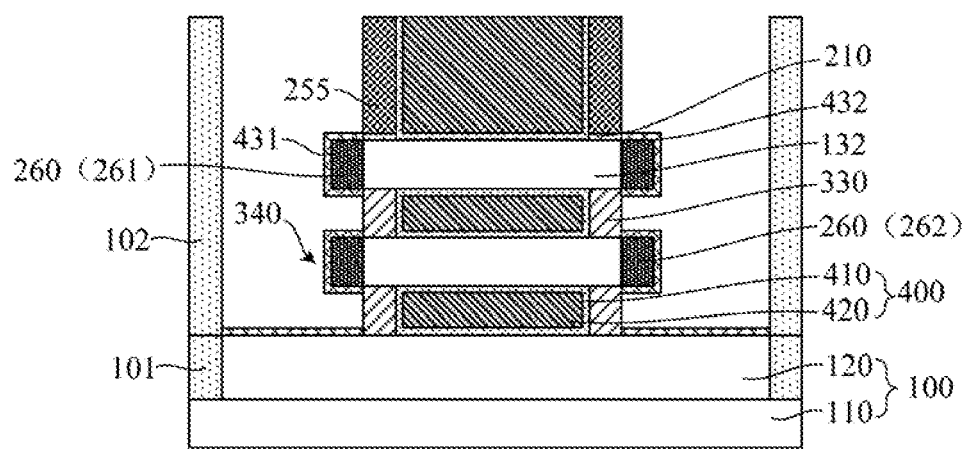

Referring to FIG. 12, a first metal silicide layer 431 is formed on a surface of the channel layer 132 corresponding to the source region 261 exposed from the interlayer dielectric layer 102, and a second metal silicide layer 432 is formed on a surface of the channel layer 132 corresponding to the drain region 262 exposed from the interlayer dielectric layer 102.

The subsequent process further includes: forming a first conductive plug covering the first metal silicide layer 431 and a second conductive plug covering the second metal silicide layer 432, the first metal silicide layer 431 being configured to reduce contact resistance of the first conductive plug with the source region 261, and the second metal silicide layer 432 being configured to reduce contact resistance of the second conductive plug and the drain region 262, thereby improving electrical performance of a device.

In some implementations, on one side of the source region 261, the first metal silicide layer 431 is formed on the surface of the channel layer 132 exposed from the opening 340. On one side of the drain region 262, the second metal silicide layer 432 is formed on the surface of the channel layer 132 exposed from the opening 340.

In some implementations, in order to simplify the process steps, the first metal silicide layer 431 and the second metal silicide layer 432 are formed in a same step.

Specifically, the step of forming the first metal silicide layer 431 and the second metal silicide layer 432 includes: forming a metal layer conformally covering a bottom and side walls of the opening 340, the metal layer further conformally covering the surface of the channel layer 132 exposed from the opening 340; and after the metal layer is formed, forming the first metal silicide layer 431 on the surface of the channel layer 132 corresponding to the source region 261, and forming the second metal silicide layer 432 on the surface of the channel layer 132 corresponding to the drain region 262 using a self-aligned salicide process.

In some implementations, during forming of the first metal silicide layer 431 and the second metal silicide layer 432 includes an atomic layer deposition process. In other words, the metal layer is formed using the atomic layer deposition process.

The atomic layer deposition process has good step coverage ability and gap filling capability, which is beneficial to improve a conformal covering effect of the metal layer on the surface of the channel layer 132, thereby improving the conformal covering effect of the first metal silicide layer 431 and the second metal silicide layer 432 on the surface of the channel layer 132 and formation quality of the first metal silicide layer 431 and the second metal silicide layer 432.

It should be noted that, during the self-aligned salicide process, the metal layer reacts only with a silicon material. Therefore, after the first metal silicide layer 431 and the second metal silicide layer 432 are formed, the method further includes: removing the metal layer to which no reaction occurs.

It should further be noted that the base 100 (as shown in FIG. 2) is exposed from the bottom of the opening 340. Therefore, on one side of the source region 261, the first metal silicide layer 431 is also formed on the surface of the base 100 exposed from the bottom of the opening 340. Likewise, on one side of the drain region 262, the second metal silicide layer 432 is also formed on the surface of the base 100 exposed from the bottom of the opening 340.

In some implementations, the metal layer is made of one or two of materials such as nickel, chin, and platinum. Correspondingly, any of the first metal silicide layer 431 and the second metal silicide layer 432 is made of one or more of a nickel silicon compound, a titanium silicon compound, and a platinum silicon compound.

Figure 13:
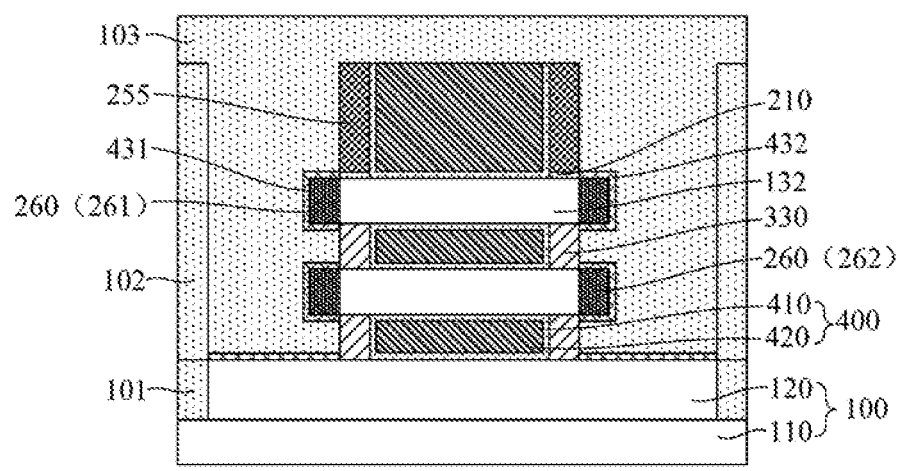

Referring to FIG. 13, the forming method further includes: filling the opening 340 to form a capping dielectric layer 103.

After the opening 340 is formed, the doped epitaxial layer 265 is completely removed, and a size of the opening 340 is relatively large. The capping dielectric layer 103 is formed, so that widths of the first conductive plug and the second conductive plug that are subsequently formed can meet process requirements.

In addition, the capping dielectric layer 103 is also configured to implement electrical isolation between adjacent devices.

Therefore, the capping dielectric layer 103 is made of an insulating material. In some implementations, the capping dielectric layer 103 is made of silicon oxide. In other implementations, the capping dielectric layer may further be made of other dielectric materials such as silicon nitride or silicon oxynitride.

In some implementations, the capping dielectric layer 103 further covers the top of the device gate structure 400, thereby providing a process basis for a conductive plug that is subsequently formed and electrically connected to the top of the device gate structure 400.

Figure 14:
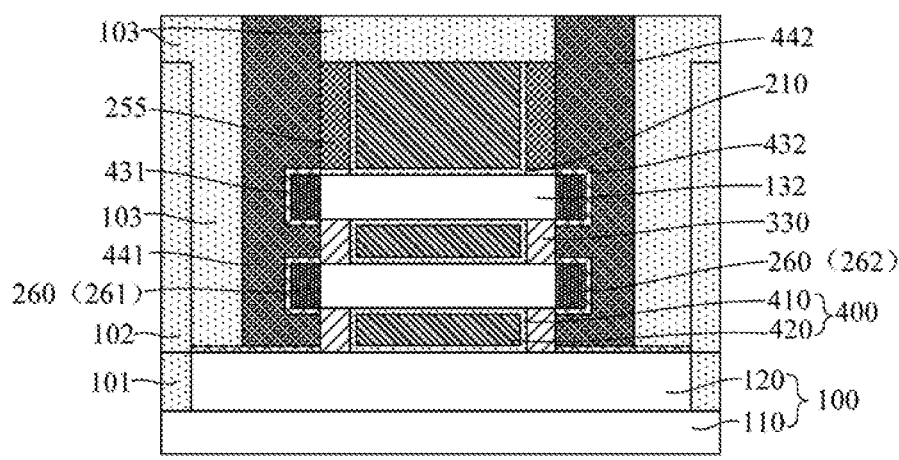

Referring to FIG. 14, a first conductive plug 441 is formed on a base 100 on one side of a source region 261, the first conductive plug 441 further covering a first metal silicide layer 431. A second conductive plug 442 is formed on the base 100 on one side of a drain region 262, the second conductive plug 442 further covering a second metal silicide layer 432.

The first conductive plug 441 is configured to implement electrical connection of the source region 261 to an external circuit, and the second conductive plug 442 is configured to implement electrical connection of the drain region 262 to an external circuit.

The first metal silicide layer 431 covers each surface of a channel layer 132 corresponding to the source region 261, and the second metal silicide layer 432 covers each surface of the channel layer 132 corresponding to the drain region 262, to achieve a metal-silicide-all-around process. Therefore, after the first conductive plug 441 is formed, a contact area of the first conductive plug 441 with the first metal silicide layer 431 is increased. Likewise, after the second conductive plug 442 is formed, a contact area of the second conductive plug 442 with the second metal silicide layer 432 is also increased, thereby reducing contact resistance of the first conductive plug 441, the second conductive plug 442, and source/drain doped regions 260, and further improving performance of the device.

In some implementations, in order to simplify the process steps, the first conductive plug 441 and the second conductive plug 442 are formed in a same step.

Specifically, capping dielectric layers 103 on both sides of the device gate structure 400 are etched to form a contact hole (not shown) exposed from the first metal silicide layer 431 and the second metal silicide layer 432. The contact hole is also exposed from the first metal silicide layer 431 and the second metal silicide layer 432 on the surface of the base 100. The contact hole is filled with a conductive material, the first conductive plug 441 being formed in the contact hole on one side of the source region 261, and the second conductive plug 442 being formed in the contact hole on one side of the drain region 262.

In some implementations, the first conductive plug 441 and the second conductive plug 442 are both made of W. In other implementations, any of the first conductive plug and the second conductive plug may further be made of Al, Cu, Ag, Au, or the like.

It should be noted that, in other implementations, the capping dielectric layer may not be formed according to an actual situation, and the first conductive plug and the second conductive plug are directly formed in the opening.

FIG. 15 to FIG. 21 are schematic structural diagrams corresponding to steps in one embodiment of a method for forming a semiconductor structure of the present disclosure.

Details about similarities between some implementations of the present disclosure and the previous embodiment are not described herein again, and a difference between some implementations of the present disclosure and the previous embodiment is that the interlayer dielectric layer 502 on one side of the drain region 612 (shown in FIG. 20) is etched after the first conductive plug 650 (shown in FIG. 18) is formed.

The first metal silicide layer and the second metal silicide layer are separately formed, which helps improve process flexibility, and it is easy to separately adjust thicknesses of the first metal silicide layer and the second metal silicide layer, thereby satisfying requirements for device performance and further improving device performance.

Figure 15:
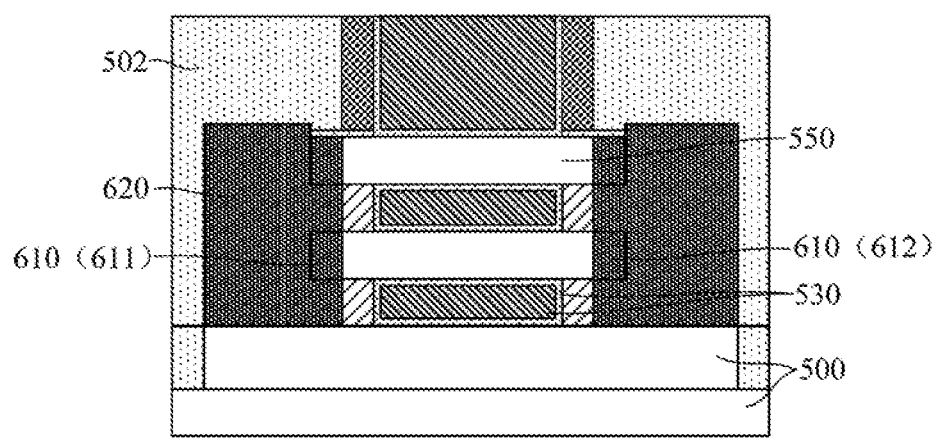
FIG. 15 to FIG. 21 are schematic structural diagrams corresponding to steps in another form of a method for forming a semiconductor structure.
Figure 16:
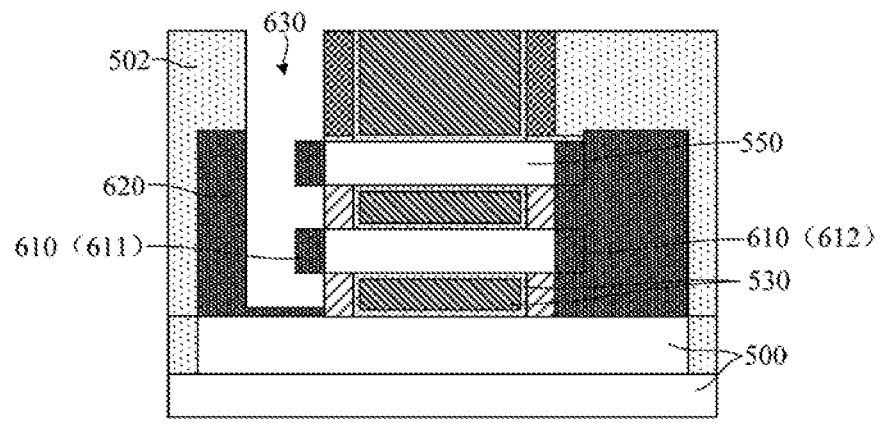

Referring to FIG. 15 and FIG. 16, after a device gate structure 530 is formed, the interlayer dielectric layer 502 on one side of a source region 611 is etched to expose each surface of a channel layer 550 corresponding to the source region 611.

Specifically, an interlayer dielectric layer 502 and a doped epitaxial layer 620 on one side of the source region 611 are etched in sequence, to expose each surface of the channel layer 550 corresponding to the source region 611.

In some implementations, in the step of etching the doped epitaxial layer 620 on one side of the source region 611, a portion of the doped epitaxial layer 620 in width is removed, so that a first opening 630 is formed in the interlayer dielectric layer 502 and the doped epitaxial layer 620, the first opening 630 being exposed from each surface of the channel layer 550 corresponding to the source region 611.

The first opening 630 is configured to provide a process basis for subsequently forming the first metal silicide layer, and is further configured to provide a spatial location for subsequently forming a first conductive plug.

A width of the first opening 630 is prevented from being excessive by removing a portion of the doped epitaxial layer 620 in width. After the first conductive plug is formed in the first opening 630, a width of the first conductive plug can meet process requirements. The width of the first opening 630 refers to a size of the first opening 630 along a direction perpendicular to a side wall of the device gate structure 530.

In some implementations, in the step of etching the doped epitaxial layer 620, a portion of the doped epitaxial layer 620 in thickness is removed, so that a portion of a remaining doped epitaxial layer 620 in thickness remains on the base 100. After the first conductive plug is subsequently formed, the first conductive plug is further in contact with the remaining doped epitaxial layer 620, which is beneficial to further reduce contact resistance of the first conductive plug and is also beneficial to avoid etching the base 100 by mistake.

For a detailed description of the process of forming the first opening 630, reference may be made to the corresponding description in the foregoing embodiments and implementations, and details are not described herein again.

It should be noted that, at a location corresponding to the device gate structure 530, before the device gate structure 530 is formed, a sacrificial layer is formed between the channel layer 550 closest to the base 500 and the base 500, and a thickness of the sacrificial layer closest to the base 500 is a pre-set thickness. After a portion of the doped epitaxial layer 620 in thickness is removed, a ratio of a thickness of the remaining doped epitaxial layer 620 on the base 500 to the pre-set thickness should not be too large. If the ratio is too large, a distance from the remaining doped epitaxial layer 620 to the channel layer 550 closest to the base 500 is too small, so that it is difficult to provide enough space for a first metal silicide layer and the first conductive plug that are subsequently formed. As a result, in some implementations, the thickness of the remaining doped epitaxial layer 620 located on the base 500 is less than or equal to one-half of the pre-set thickness.

Figure 17:
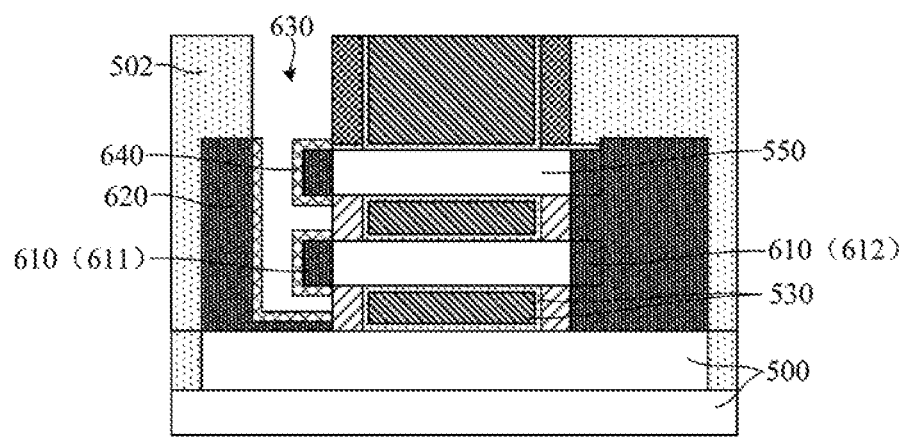

Referring to FIG. 17, a first metal silicide layer 640 is formed on a surface of a channel layer 550 exposed from the first opening 630.

In some implementations, the first opening 630 is exposed from a top face, a bottom face, and a side wall of the channel layer 550 corresponding to the source region 611. Therefore, the first metal silicide layer 640 covers each surface of the channel layer 550 corresponding to the source region 611.

The process of forming the first metal silicide layer 611 is not affected by a second metal silicide layer. Therefore, a thickness of the first metal silicide layer 611 may be adjusted, so that the thickness of the first metal silicide layer 611 can meet the requirements of device performance.

In some implementations, the first opening 630 is also exposed from the remaining doped epitaxial layer 620. Therefore, the first metal silicide layer 640 is also formed on the surface of the remaining doped epitaxial layer 620.

For a detailed description of the process of forming the first metal silicide layer 640, reference may be made to the corresponding description in the foregoing embodiments and implementations, and details are not described herein again.

Figure 18:
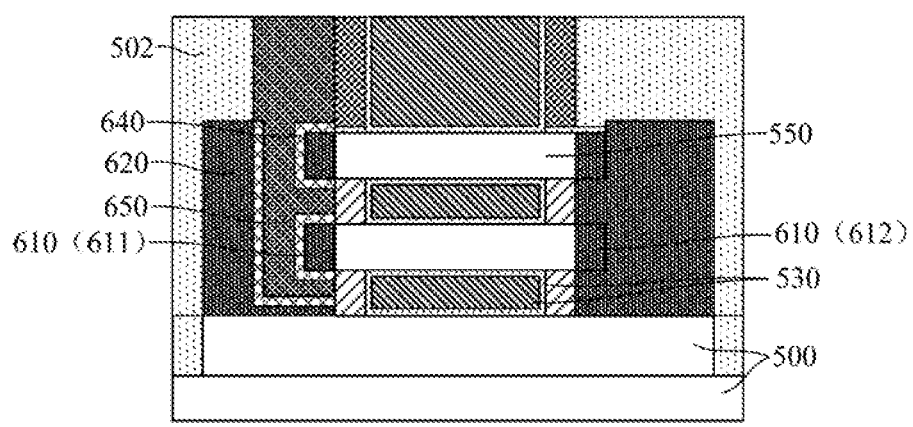

Referring to FIG. 18, a first conductive plug 650 is formed in the first opening 630 (as shown in FIG. 17), the first conductive plug 650 further covering the first metal silicide layer 611.

In some implementations, the first conductive plug 650 is not only in contact with the first metal silicide layer 640 on the surface of the channel layer 550 but also in contact with the first metal silicide layer 640 on the surface of the remaining doped epitaxial layer 620, thereby further reducing contact resistance of the first conductive plug 650 and helping further improve the performance of the device.

For a detailed description of the process of forming the first conductive plug 650, reference may be made to the corresponding description in the foregoing embodiments and implementations, and details are not described herein again.

Figure 19:
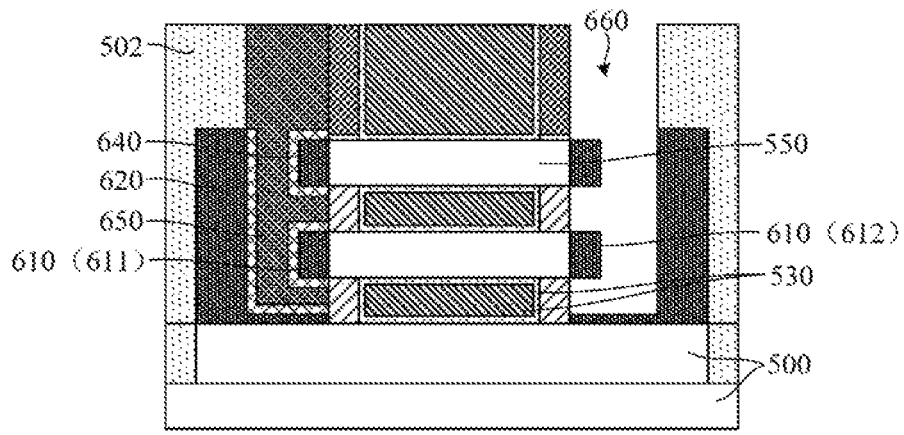

Referring to FIG. 19, after the first conductive plug 650 is formed, an interlayer dielectric layer 502 on one side of a drain region 612 is etched to expose each surface of a channel layer 550 corresponding to the drain region 612.

Specifically, the interlayer dielectric layer 502 and a doped epitaxial layer 620 on one side of the drain region 612 are etched in sequence, to expose each surface of the channel layer 550 corresponding to the drain region 612.

A second opening 660 is formed in the interlayer dielectric layer 502 and the doped epitaxial layer 620, the second opening 660 being exposed from each surface of the channel layer 550 corresponding to the drain region 612.

In some implementations, in the step of etching the doped epitaxial layer 620 on one side of the drain region 612, a portion of the doped epitaxial layer 620 in width is removed, so that a second opening 660 is formed in the interlayer dielectric layer 502 and the doped epitaxial layer 620, the second opening 660 being exposed from each surface of the channel layer 550 corresponding to the drain region 612.

The second opening 660 is configured to provide a process basis for subsequently forming the second metal silicide layer, and is further configured to provide a spatial location for subsequently forming a second conductive plug.

A width of the second opening 660 is prevented from being excessive by removing a portion of the doped epitaxial layer 620 to reduce its width. After the second conductive plug is formed in the second opening 660, a width of the second conductive plug can meet process requirements. The width of the second opening 660 refers to a size of the second opening 660 along a direction perpendicular to a side wall of the device gate structure 530.

In some implementations, in the step of etching the doped epitaxial layer 620, a portion of the doped epitaxial layer 620 in thickness is removed, so that a portion of a remaining doped epitaxial layer 620 in thickness remains on the base 100. After the second conductive plug is subsequently formed, the second conductive plug is further in contact with the remaining doped epitaxial layer 620, which is beneficial to further reduce contact resistance of the second conductive plug and is also beneficial to avoid etching the base 100 by mistake.

In some implementations, at a location corresponding to the device gate structure 530, before the device gate structure 530 is formed, a sacrificial layer is formed between the channel layer 550 closest to the base 500 and the base 500, and a thickness of the sacrificial layer closest to the base 500 is a pre-set thickness. After the second opening 660 is formed, a thickness of the remaining doped epitaxial layer 620 on the base 500 is less than or equal to one-half of the pre-set distance.

For a detailed description of the process step of forming the second opening 660, reference may be made to the corresponding description of process steps of forming the first opening 630 (as shown in FIG. 17), and details are not described herein again.

Figure 20:
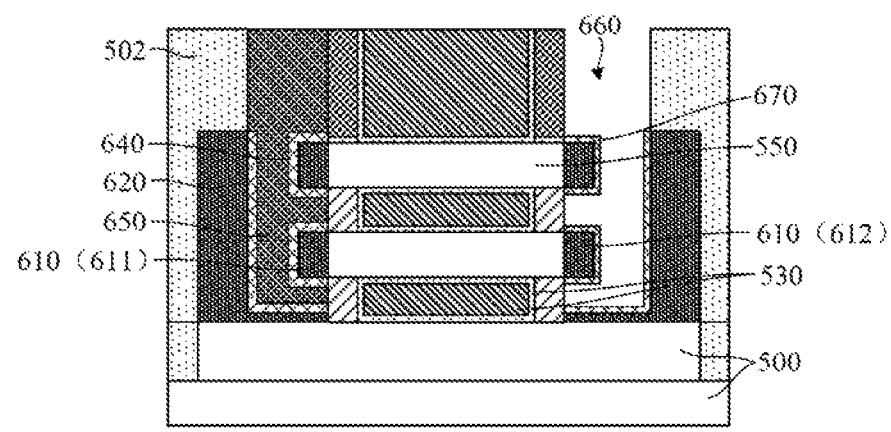

Referring to FIG. 20, a second metal silicide layer 670 is formed on a surface of a channel layer 550 exposed from the second opening 660 (as shown in FIG. 20).

In some implementations, the second opening 660 is exposed from a top face, a bottom face, and a side wall of the channel layer 550 corresponding to a drain region 612. Therefore, the second metal silicide layer 670 covers surfaces of the channel layer 550 corresponding to the drain region 612.

The process of forming the second metal silicide layer 670 is not affected by a first metal silicide layer 611. Therefore, a thickness of the second metal silicide layer 670 may be adjusted, so that the thickness of the first metal silicide layer 611 can meet the requirements of device performance.

In some implementations, the thickness of the first metal silicide layer 611 is defined as a first thickness, and the thickness of the second metal silicide layer 670 is defined as a second thickness, the first thickness being greater than the second thickness.

Increasing the thickness of the metal silicide layer can help reduce the contact resistance, but a junction leakage current between the source/drain doped region 610 and the base is correspondingly increased. However, when the device is in operation, a voltage applied to the source region 612 is less than a voltage applied to the drain region 611. Therefore, the first metal silicide layer 611 has a relatively large thickness, so that the second metal silicide layer 670 has a relatively small thickness, which can reduce the junction leakage current between the source/drain doped region 610 and the base while reducing contact resistance.

In some implementations, the second opening 660 is also exposed from the remaining doped epitaxial layer 620. Therefore, the second metal silicide layer 670 is also formed on the surface of the remaining doped epitaxial layer 620.

For a detailed description of the process of forming the second metal silicide layer 670, reference may be made to the corresponding description in the foregoing embodiments and implementations, and details are not described herein again.

Figure 21:
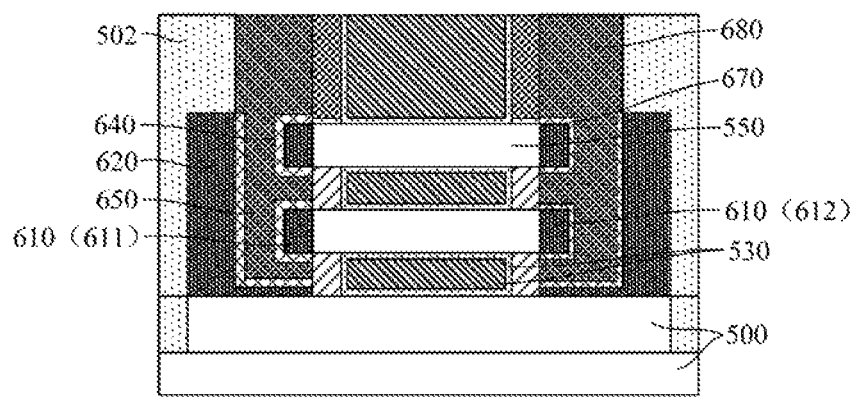

Referring to FIG. 21, a second conductive plug 680 is formed in the second opening 660 (as shown in FIG. 21), the second conductive plug 680 further covering the second metal silicide layer 670.

In some implementations, the second conductive plug 680 is not only in contact with the second metal silicide layer 670 on the surface of the channel layer 550 but also in contact with the second metal silicide layer 670 on the surface of the remaining doped epitaxial layer 620, thereby further reducing contact resistance of the second conductive plug 680 and helping further improve the performance of the device.

For a detailed description of the process of forming the second conductive plug 680, reference may be made to the corresponding description in the foregoing embodiments and implementations, and details are not described herein again.

It should be noted that, in other implementations, after the second conductive plug is formed, an interlayer dielectric layer on one side of the source region may alternatively be etched.

Figure 22:
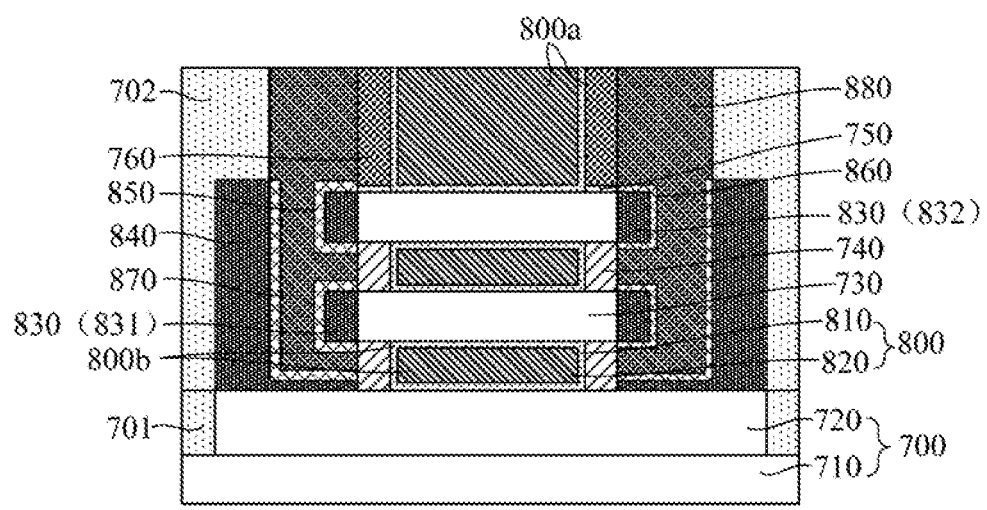
FIG. 22 is a schematic structural diagram of one form of a semiconductor structure.

Correspondingly, the present disclosure further provides a semiconductor structure. Referring to FIG. 22, a schematic structural diagram of an embodiment of a semiconductor structure according to the present disclosure is shown.

The semiconductor structure includes: a base 700; a channel structure layer (not shown) located on the base 700 and spaced apart from the base 700, the channel structure layer including one or more channel layers 730 spaced apart; a device gate structure 800 spanning the channel structure layer and surrounding the channel layer 730; source/drain doped regions 830 located in channel layers on both sides of the device gate structure 800, where a source/drain doped region 830 on one side of the device gate structure 800 serves as a source region 831, and a source/drain doped region 830 on the other side of the device gate structure 800 serves as a drain region 832; a first metal silicide layer 850 covering each surface of the channel layer 730 corresponding to the source region 831; a second metal silicide layer 860 covering each surface of the channel layer 730 corresponding to the drain region 832; a first conductive plug 870 located on the base 700 on one side of the device gate structure 800, the first conductive plug 870 further covering the first metal silicide layer 850; a second conductive plug 880 located on the base 700 on the other side of the device gate structure 800, the second conductive plug 880 further covering the second metal silicide layer 860; and an interlayer dielectric layer 702 located on the base 700 exposed from the device gate structure 800, the first conductive plug 870, and the second conductive plug 880, the interlayer dielectric layer 702 covering side walls of the first conductive plug 870 and the second conductive plug 880.

The source/drain doped regions 830 are located in the channel layers 730 on both sides of the device gate structure 800. The first metal silicide layer 850 covers each surface of a channel layer 730 corresponding to the source region 831, and the second metal silicide layer 860 covers each surface of the channel layer 730 corresponding to the drain region 832, to achieve a metal-silicide-all-around process. Therefore, a contact area of the first conductive plug 870 with the first metal silicide layer 850 is increased. Likewise, a contact area of the second conductive plug 880 with the second metal silicide layer 860 is also increased, thereby helping reduce contact resistance of the first conductive plug 870, the second conductive plug 880, and source/drain doped regions 830, and further helping improve performance of the device.

In some implementations, the base 700 includes a substrate 710 and a fin 720 protruding from the substrate 710. In other implementations, the base is a planar substrate.

In some implementations, the substrate 710 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In some implementations, the fin 720 and the substrate 710 are formed into an integrated structure. In other implementations, the fin may also be a semiconductor layer epitaxially growing on the substrate.

To this end, in some implementations, the fin 720 and the substrate 710 are made of a same material, and the fin 720 is made of silicon. In other implementations, the fin may also be made of a semiconductor material suitable for forming the fin, such as germanium, silicon germanide, silicon carbide, gallium arsenide, or indium gallium. The material of the fin may also be different from the material of the substrate.

The channel structure layer includes one or more channel layers 730 spaced apart, the channel layer 730 being suspended on the base 700 at intervals, and the channel layer 730 being configured to provide a channel of the device.

As an example, the channel structure layer includes two channel layers 730. In other implementations, according to process requirements, there may further be one or more than two channel layers in each channel structure layer.

In some implementations, according to device performance requirements, the channel layer 730 is made of Si. In other implementations, the channel layer may also be made of SiGe.

In some implementations, an isolation layer 701 is formed on the substrate 710 exposed from the fin 720, the isolation layer 701 covering a side wall of the fin 720.

The isolation layer 701 is configured to isolate adjacent devices. In some implementations, the isolation layer 701 is made of silicon oxide. In other implementations, the isolation layer may also be made of other insulating materials such as silicon nitride or silicon oxynitride.

In some implementations, a top face of the isolation layer 701 is flush with a top face of the fin 720, thereby reducing the probability that the fin 720 is configured to form a parasitic device.

The device gate structure 800 is configured to control opening and closing of a device channel.

In some implementations, the device gate structure 800 includes a gate dielectric layer 810 and a gate electrode layer 820 located on the gate dielectric layer 810.

The gate dielectric layer 810 is made of a high-k dielectric material. In some implementations, the gate dielectric layer 810 is made of $HfO_2$. In other implementations, the gate dielectric layer may also be made of a material selected from $ZrO_2$, HfSiO, HfSiON, HfTaO, HfTiO, HfZrO, or $Al_2O_3$, or the like.

In some implementations, the gate electrode layer 820 is made of W. In other implementations, the gate electrode layer may further be made of Al, Cu, Ag, Au, Pt, Ni, Ti, or the like.

In some implementations, the device gate structure 800 spanning the channel structure layer is a first portion 800a of the device gate structure, and the device gate structure 800 surrounding the channel layer 730 is a second portion 800b of the device gate structure.

It should be noted that, along a direction perpendicular to a side wall of the device gate structure 800, when an end of the second portion 800b of the device gate structure is retracted into the first portion 800a of the device gate structure, on either side of the device gate structure 800, a distance from the side wall of the second portion 800b of the device gate structure to the side wall of the first portion 800a of the device gate structure is a negative value. When the end of the second portion 800b of the device gate structure protrudes from the first portion 800a of the device gate structure, a distance from the side wall of the second portion 800b of the device gate structure second to the side wall of the first portion 800a of the device gate structure is a positive value.

On either side of the device gate structure 800, a distance from the side wall of the second portion 800b of the device gate structure to the side wall of the first portion 800a of the device gate structure should be neither excessively small nor excessively large. If the distance is too small, that is, along the direction perpendicular to the side wall of the device gate structure 800, when the width of the second portion 800b of the device gate structure is too small, a width of the portion for surrounding the channel layer 730 in the device gate structure 800 is too small, thereby easily reducing control capability of the device gate structure 800 to the channel, and further having bad influence on performance of the device. If the distance is too large, that is, along the direction perpendicular to the side wall of the device gate structure 800, when the width of the second portion 800b of the device gate structure is too large, a volume of the source/drain doped region 830 is correspondingly caused to be too small, thereby having bad influence on performance of the device. In addition, the first metal silicide layer 850 covers each surface of the channel layer 730 corresponding to the source region 831, and the second metal silicide layer 860 covers each surface of the channel layer 730 corresponding to the drain region 832. This correspondingly reduces surface areas of the first metal silicide layer 850 and the second metal silicide layer 860, which is not beneficial to reduce contact resistance of the first conductive plug 870, the second conductive plug 880, and the source/drain doped region 830. Accordingly, in some implementations, the distance from the side wall of the second portion 800b of the device gate structure to the side wall of the first portion 800a of the device gate structure is −3 nm to 3 nm.

In some implementations, a source/drain doped region 830 on one side of the device gate structure 800 serves as a source region 831, and a source/drain doped region 830 on the other side of the device gate structure 800 serves as a drain region 832.

When the semiconductor structure is a PMOS transistor, doped ions in the source/drain doped region 830 are P-type ions, the P-type ions including B, Ga or In. When the semiconductor structure is an NMOS transistor, doped ions in the source/drain doped region 830 are N-type ions, the N-type ions including P, As, or Sb.

The first metal silicide layer 850 is configured to reduce contact resistance of the first conductive plug 870 with the source region 831, and the second metal silicide layer 860 is configured to reduce contact resistance of the second conductive plug 880 and the drain region 832, thereby improving electrical performance of a device.

In some implementations, the thickness of the first metal silicide layer 850 is greater than the thickness of the second metal silicide layer 860.

Increasing the thickness of the metal silicide layer can help reduce the contact resistance, but correspondingly increases a junction leakage current between the source/drain doped region 830 and the base 700 is correspondingly increased. However, when the device is in operation, a voltage applied to the source region 831 is less than a voltage applied to the drain region 832. Therefore, the first metal silicide layer 850 has a relatively large thickness, so that the second metal silicide layer 860 has a relatively small thickness, which can reduce the junction leakage current between the source/drain doped region 830 and the base while reducing contact resistance.

In some implementations, any of the first metal silicide layer 850 and the second metal silicide layer 860 is made of one or more of a nickel silicon compound, a titanium silicon compound, and a platinum silicon compound.

The interlayer dielectric layer 702 is configured to achieve electrical isolation between adjacent devices.

Therefore, the interlayer dielectric layer 702 is made of an insulating material. In some implementations, the interlayer dielectric layer 702 is made of silicon oxide. In other implementations, the interlayer dielectric layer may also be made of other dielectric materials such as silicon nitride or silicon oxynitride.

In some implementations, the interlayer dielectric layer 702 is located on a substrate 710 exposed from the fin 720.

The first conductive plug 870 is configured to implement electrical connection of the source region 831 to an external circuit, and the second conductive plug 880 is configured to implement electrical connection of the drain region 832 to an external circuit.

In some implementations, the first conductive plug 870 and the second conductive plug 880 are both made of W. In other implementations, any of the first conductive plug and the second conductive plug may further be made of Al, Cu, Ag, Au, or the like.

In some implementations, the source/drain doped region 830 is formed in a manner of ion diffusion. Therefore, the semiconductor structure further includes: a doped epitaxial layer 840 located between a portion of a side wall of the first conductive plug 870 close to one side of the base 700 and the interlayer dielectric layer 702 and located between a portion of a side wall of the second conductive plug 880 close to one side of the base 700 and the interlayer dielectric layer 702.

During the formation of the semiconductor structure, before the first conductive plug 870 and the second conductive plug 880 are formed, the doped epitaxial layer 840 covers the top face, the bottom face and the side wall of the channel layer 730 corresponding to the source region 831 and the drain region 832. The doped ions in the doped epitaxial layer 840 diffuse into the channel layer 730, thereby forming the source region 831 and the drain region 832, which can help improve doping concentration uniformity in the channel layer 132.

In some implementations, the doped epitaxial layer 840 is made to cover a portion of the side wall of the first conductive plug 870 and a portion of the side wall of the second conductive plug 880. During formation of the first conductive plug 870 and the second conductive plug 880, it is easy to make widths of the first conductive plug 870 and the second conductive plug 880 satisfy process requirements.

Correspondingly, the first metal silicide layer 850 is further located between the first conductive plug 870 and the doped epitaxial layer 840, and the second metal silicide layer 860 is also located between the second conductive plug 880 and the doped epitaxial layer 840.

The first conductive plug 870 is not only in contact with the first metal silicide layer 850 on the surface of the channel layer 730 but also in contact with the first metal silicide layer 850 on the surface of the remaining doped epitaxial layer 840, thereby further reducing contact resistance of the first conductive plug 870 and helping further improve the performance of the device.

Likewise, the second conductive plug 880 is not only in contact with the second metal silicide layer 860 on the surface of the channel layer 730 but also in contact with the second metal silicide layer 860 on the surface of the doped epitaxial layer 840, thereby further reducing contact resistance of the second conductive plug 880 and helping further improve the performance of the device.

In some implementations, the doped epitaxial layer 840 is further located between the first conductive plug 870 and the base 700, and between the second conductive plug 880 and the base 700, thereby further reducing contact resistance of the first conductive plug 870 and contact resistance of the second conductive plug 880.

It should be noted that the thickness of the second portion 800b of the device gate structure closest to the base 700 is a preset thickness, and a ratio of a thickness of the doped epitaxial layer 840 on the base 700 to the preset thickness should not be too large. If the ratio is too large, a distance from the doped epitaxial layer 840 to the channel layer 730 closest to the base 700 is too small, so that it is difficult to provide enough space for forming the first metal silicide layer 850, the second metal silicide layer 860, the first conductive plug 870, and the second conductive plug 880. As a result, in some implementations, the thickness of the doped epitaxial layer 840 located on the base 700 is less than or equal to one-half of the preset thickness.

When the semiconductor structure is a PMOS transistor, the doped epitaxial layer 870 is made of silicon or silicon germanium doped with P-type ions, the P-type ions including B, Ga or In. When the semiconductor structure is an NMOS transistor, the doped epitaxial layer 870 is made of silicon, silicon carbide, or silicon germanium doped with N-type ions, the N-type ions including P, As, or Sb.

In other implementations, according to an actual situation, for example, according to an initial width of the doped epitaxial layer and target widths of the first conductive plug and the second conductive plug, the doped epitaxial layer may also be removed during forming of the first conductive plug and the second conductive plug, and the semiconductor structure may not contain the doped epitaxial layer.

In some implementations, the semiconductor structure further includes: a barrier layer 740 located between the second portion 800b of the device gate structure and the first conductive plug 870 and between the second portion 800b of the device gate structure and the second conductive plug 880, a thickness of the barrier layer 740 being less than a length of a channel layer 730 exposed from the second portion 800b of the device gate structure.

The barrier layer 740 can be used to reduce parasitic capacitance of the device gate structure 800 and the first conductive plug 870 and parasitic capacitance of the device gate structure 800 and the second conductive plug 880, helping further improve the performance of the device.

Therefore, the barrier layer 740 is made of a dielectric material such as silicon nitride, silicon oxynitride, silicon borohydride, silicon oxynitride, or silicon oxynitride.

In some implementations, the barrier layer 740 is made of silicon nitride.

It should be noted that a ratio of a thickness of the barrier layer 740 to a length of the channel layer 730 exposed from the second portion 800b of the device gate structure should be neither extremely low nor extremely high. If the ratio is extremely low, the thickness of the barrier layer 740 is correspondingly extremely low, thereby easily causing parasitic capacitance of the device gate structure 800 and the first conductive plug 870 and parasitic capacitance of the device gate structure 800 and the second conductive plug 880 to be excessively large. If the ratio is extremely high, the thickness of the barrier layer 740 is correspondingly extremely high, thereby easily causing contact area of the first metal silicide layer 850 with the channel layer 730 corresponding to the source region 831 to be extremely small and contact area of the second metal silicide layer 860 with the channel layer 730 corresponding to the drain region 832 to be extremely small. To this end, in some implementations, the thickness of the barrier layer 740 is ⅕ to ⅓ of the length of the channel layer 730 exposed from the second portion 800b of the device gate structure.

In some implementations, the semiconductor structure further includes: a remaining spacer 760 located on a side wall of the device gate structure 800, a side wall of the remaining spacer 760 being flush with a side wall of a barrier layer 740 on a same side.

The remaining spacer 760 is configured to protect side walls of the device gate structure 800.

The side walls of the remaining spacers 760 are flush with the side walls of barrier layer 740 on the same side, which increases a surface area of the channel layer 730 exposed from the device gate structure 800, which correspondingly helps increase the contact area of the first metal silicide layer 850 with the channel layer 730 corresponding to the source region 831 and increase the contact area of the second metal silicide layer 860 with the channel layer 730 corresponding to the drain region 832.

The remaining spacer 760 may be made of one or more of silicon oxide, silicon nitride, silicon carbide, silicon carbonitride, silicon oxy-carbonitride, silicon oxynitride, boron nitride, and boron carbonitride, and the remaining spacer 760 may be a single-layer structure or a stack structure. In some implementations, the remaining spacer 760 is made of silicon nitride.

The remaining spacer 760 and the barrier layer 740 are made of a same material. During forming of the semiconductor structure, the remaining spacer 760 is formed through laterally etching the spacer, and the barrier layer 740 is formed through laterally etching an initial barrier layer. The remaining spacer 760 and the barrier layer 740 are made of the same material. When the initial barrier layer is laterally etched, the spacer of the partial thickness is also laterally etched to form the remaining spacer 760, which helps simplify the process steps.

The semiconductor structure may be formed using the forming method described in the foregoing embodiments and implementations, or may be formed using other forming methods. For detailed descriptions of the semiconductor structure in implementations described below, reference may be made to the respective descriptions in the foregoing embodiments and implementations, and details are not described again in some implementations.

Figure 23:
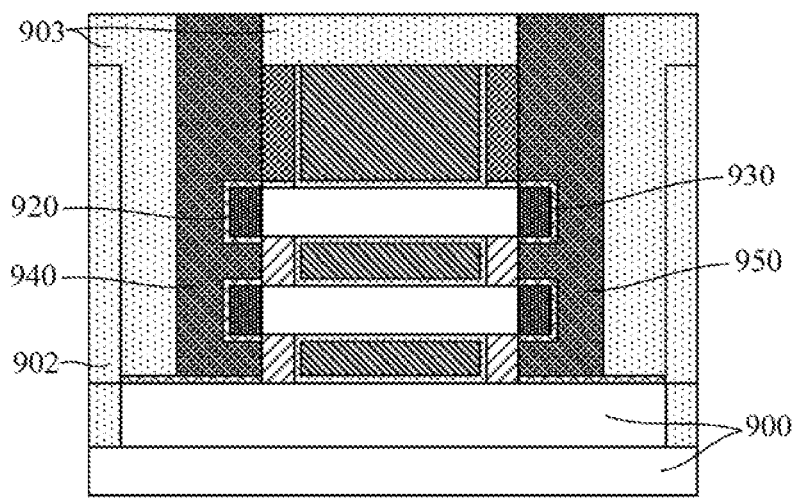
FIG. 23 is a schematic structural diagram of another form of a semiconductor structure.

The present disclosure further provides another semiconductor structure. Referring to FIG. 23, a schematic structural diagram of another form of a semiconductor structure according to the present disclosure is shown.

Details about similarities between implementations of the present disclosure described below and previous embodiments and implementations are not described herein again, and a difference between implementations of the present disclosure described below and the previous embodiments and implementations is that a thickness of a first metal silicide layer 920 is equal to a thickness of a second metal silicide layer 930.

The thickness of the first metal silicide layer 920 is equal to the thickness of the second metal silicide layer 930, which can help simplify the process steps.

In some implementations, a doped epitaxial layer is removed during formation of a first conductive plug 940 and a second conductive plug 950. Therefore, the semiconductor structure further includes: a capping dielectric layer 903 located between the first conductive plug 940 and an interlayer dielectric layer 902 and between the second conductive plug 950 and the interlayer dielectric layer 902.

The capping dielectric layer 903 is used, so that widths of the first conductive plug 940 and the second conductive plug 950 can meet process requirements. In addition, the capping dielectric layer 903 is also configured to implement electrical isolation between adjacent devices.

Therefore, the capping dielectric layer 903 is made of an insulating material. In some implementations, the capping dielectric layer 903 is made of silicon oxide. In other implementations, the capping dielectric layer may further be made of other dielectric materials such as silicon nitride or silicon oxynitride.

In some implementations, the capping dielectric layer 903 further covers the top of the device gate structure 400, thereby providing a process basis for a conductive plug that is subsequently formed and electrically connected to the top of the device gate structure 400.

Correspondingly, the capping dielectric layer 903 also covers the top of the interlayer dielectric layer 902.

During the formation of the semiconductor structure, before the first conductive plug 940, the second conductive plug 950, and the capping dielectric layer 903 are formed, the first metal silicide layer 920 and the second metal silicide layer 930 are formed. Therefore, the first metal silicide layer 920 is also located between the bottom of the first conductive plug 940 and the capping dielectric layer 903 and the base 900, and the second metal silicide layer 930 is also located between the bottom of the second conductive plug 950 and the capping dielectric layer 903 and the base 900.

The semiconductor structure may be formed using the forming method described in the foregoing embodiments and implementations, or may be formed using other forming methods. For detailed descriptions of the semiconductor structure in the present implementations, reference may be made to the respective descriptions in the foregoing embodiments and implementations, and details are not described again in some implementations.

Although the present disclosure is disclosed above, the present disclosure is not limited thereto. Any changes and modifications may be made by those skilled in the art without departing from the spirit and scope of the present disclosure. Therefore, protection scope of the present disclosure should be subject to scope defined by the claims.

What is claimed is:

1. A method for forming a semiconductor structure, comprising:
   providing a base, where one or more stacked channel stacks is formed on the base, the channel stack comprises a sacrificial layer and a channel layer located on the sacrificial layer, a gate structure is formed on the base, and the gate structure spans the channel stack and covers a portion of a top and a portion of a side wall of the channel stack;
   forming, in the channel stack on both sides of the gate structure, a groove exposing the base;
   laterally etching, along a direction perpendicular to a side wall of the gate structure, a portion of the sacrificial layer exposed from the groove, to form a remaining sacrificial layer under the gate structure;
   forming a source/drain doped region in the channel layer exposed from the remaining sacrificial layer, wherein the source/drain doped region located on one side of the gate structure serves as a source region, and the source/drain doped region located on the other side of the gate structure serves as a drain region;
   forming an interlayer dielectric layer on the base exposed from the gate structure after the source/drain doped region is formed, the interlayer dielectric layer covering a side wall of the gate structure;
   etching the interlayer dielectric layer on one side of the source region to expose each surface of the channel layer corresponding to the source region;
   etching the interlayer dielectric layer on one side of the drain region to expose each surface of the channel layer corresponding to the drain region;
   forming a first metal silicide layer on a surface of the channel layer corresponding to the source region exposed from the interlayer dielectric layer;
   forming a second metal silicide layer on a surface of the channel layer corresponding to the drain region exposed from the interlayer dielectric layer;
   forming a first conductive plug on a base on one side of the source region, the first conductive plug further covering the first metal silicide layer; and
   forming a second conductive plug on a base on one side of the drain region, the second conductive plug further covering the second metal silicide layer.

2. The method for forming the semiconductor structure according to claim 1, wherein:
   the step of forming the source/drain doped region comprises: forming a doped epitaxial layer in the groove, the doped epitaxial layer covering a surface of the channel layer exposed from the remaining sacrificial layer, and doped ions in the doped epitaxial layer diffusing into the channel layer, to form the source/drain doped region in the channel layer; and
   in the step of forming the interlayer dielectric layer on the base exposed from the gate structure, the interlayer dielectric layer covers the source/drain doped region.

3. The method for forming the semiconductor structure according to claim 2, wherein the step of forming the doped epitaxial layer in the groove comprises: forming an epitaxial layer in the groove, and performing in-situ self-doping during forming of the epitaxial layer.

4. The method for forming the semiconductor structure according to claim 2, wherein:
   the interlayer dielectric layer and the doped epitaxial layer on one side of the source region are etched in sequence, to expose each surface of the channel layer corresponding to the source region; and
   the interlayer dielectric layer and the doped epitaxial layer on one side of the drain region are etched in sequence, to expose each surface of the channel layer corresponding to the drain region.

5. The method for forming the semiconductor structure according to claim 4, wherein:
   in the step of etching the doped epitaxial layer on one side of the source region, the doped epitaxial layer is removed, or a portion of the doped epitaxial layer is removed to reduce its width; and
   in the step of etching the doped epitaxial layer on one side of the drain region, the doped epitaxial layer is removed, or a portion of the doped epitaxial layer is removed to reduce its width.

6. The method for forming the semiconductor structure according to claim 2, wherein:
   in the step of forming the doped epitaxial layer, the doped epitaxial layer has a first preset doping concentration;
   in the step of forming the source/drain doped region, the source/drain doped region has a second preset doping concentration; and
   the first preset doping concentration is 1.5 times to 5 times of the second preset doping concentration.

7. The method for forming the semiconductor structure according to claim 4, wherein in the step of etching the doped epitaxial layer, a portion of the doped epitaxial layer is removed to reduce the doped epitaxial layer in width.

8. The method for forming the semiconductor structure according to claim 1, wherein:
- the interlayer dielectric layer on one side of the source region and the interlayer dielectric layer on one side of the drain region are etched in a same step,
- the first metal silicide layer and the second metal silicide are formed in a same step, and
- the first conductive plug and the second conductive plug are formed in a same step.

9. The method for forming the semiconductor structure according to claim 8, wherein:
- in the step of etching the doped epitaxial layer on one side of the source region, the doped epitaxial layer is removed;
- in the step of etching the doped epitaxial layer on one side of the drain region, the doped epitaxial layer is removed;
- the method further comprises: after the first metal silicide layer and the second metal silicide layer are formed, and before the first conductive plug and the second conductive plug are formed, forming a capping dielectric layer on a base exposed from the interlayer dielectric layer; and
- in the step of forming the first conductive plug and the second conductive plug, the first conductive plug and the second conductive plug are formed in the capping dielectric layer.

10. The method for forming the semiconductor structure according to claim 1, wherein:
- after the first conductive plug is formed, the interlayer dielectric layer on one side of the drain region is etched; or
- after the second conductive plug is formed, the interlayer dielectric layer on one side of the source region is etched.

11. The method for forming the semiconductor structure according to claim 1, wherein:
- in the step of forming the first metal silicide layer, the first metal silicide layer has a first thickness;
- in the step of forming the second metal silicide layer, the second metal silicide layer has a second thickness; and
- the first thickness is greater than the second thickness.

12. The method for forming the semiconductor structure according to claim 1, wherein the method further comprises:
- before forming the source/drain doped region, forming a barrier layer on a side wall of the remaining sacrificial layer, where the barrier layer has a thickness that is smaller than a length of the channel layer exposed from the remaining sacrificial layer.

13. The method for forming the semiconductor structure according to claim 12, wherein:
- the step of forming the barrier layer comprises: forming an initial barrier layer on the side wall of the remaining sacrificial layer, where a side wall of the initial barrier layer is flush with a side wall of the channel layer exposed from the remaining sacrificial layer; and
- laterally etching a portion of the initial barrier layer in thickness along a direction perpendicular to the side wall of the gate structure, where the remaining initial barrier layer serves as the barrier layer.

14. The method for forming the semiconductor structure according to claim 13, wherein:
- in the step of providing the base, a spacer is formed on the side wall of the gate structure;
- the step of forming the groove comprises: etching channel stacks on both sides of the gate structure using the spacer as a mask; and
- in the step of laterally etching the portion of the initial barrier layer in thickness, laterally etching a portion of the spacer in thickness.

15. The method for forming the semiconductor structure according to claim 13, wherein the portion of the initial barrier layer in thickness is laterally etched using an isotropic dry etching process.

16. The method for forming the semiconductor structure according to claim 1, wherein a process for forming any of the first metal silicide layer and the second metal silicide layer comprises an atomic layer deposition process.

* * * * *